United States Patent
Tanaka et al.

(10) Patent No.: US 9,691,608 B2
(45) Date of Patent: Jun. 27, 2017

(54) SILICON CARBIDE SUBSTRATE, SILICON CARBIDE SEMICONDUCTOR DEVICE, AND METHODS FOR MANUFACTURING SILICON CARBIDE SUBSTRATE AND SILICON CARBIDE SEMICONDUCTOR DEVICE

(71) Applicant: Sumitomo Electric Industries, Ltd., Osaka-shi (JP)

(72) Inventors: So Tanaka, Osaka (JP); Shunsuke Yamada, Osaka (JP); Taku Horii, Osaka (JP); Akira Matsushima, Itami (JP); Ryosuke Kubota, Osaka (JP); Kyoko Okita, Itami (JP); Takayuki Nishiura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/786,063

(22) PCT Filed: Apr. 3, 2014

(86) PCT No.: PCT/JP2014/059825
§ 371 (c)(1),
(2) Date: Oct. 21, 2015

(87) PCT Pub. No.: WO2014/192411
PCT Pub. Date: Dec. 4, 2014

(65) Prior Publication Data
US 2016/0086798 A1     Mar. 24, 2016

(30) Foreign Application Priority Data

May 29, 2013 (JP) .................. 2013-113090

(51) Int. Cl.
*H01L 21/00* (2006.01)
*H01L 29/00* (2006.01)
(Continued)

(52) U.S. Cl.
CPC ........ *H01L 21/02529* (2013.01); *C30B 25/18* (2013.01); *C30B 25/20* (2013.01);
(Continued)

(58) Field of Classification Search
CPC ......... H01L 21/02636; H01L 21/02378; H01L 21/02529; H01L 21/3065; H01L 21/02164;
(Continued)

(56) References Cited

U.S. PATENT DOCUMENTS 5,385,855 A * 1/1995 Brown ................ H01L 21/7602
148/DIG. 148
5,915,180 A * 6/1999 Hara .................... H01L 29/1608
257/328

(Continued)

FOREIGN PATENT DOCUMENTS

| CN | 1441965 A | 9/2003 |
|---|---|---|
| CN | 101542688 A | 9/2009 |

(Continued)

OTHER PUBLICATIONS

CREE Material Catalog (at http://www.cree.com/~/media/Files/Cree/Chips-and-Material/Data-Sheets-Material/MATCATALOG.pdf, published on Apr. 9, 2014).*
(Continued)

*Primary Examiner* — Nikolay Yushin
(74) *Attorney, Agent, or Firm* — Venable LLP; Michael A. Sartori; Laura G. Remus

(57) ABSTRACT

A method for manufacturing a silicon carbide substrate includes the following steps. There is prepared a silicon
(Continued)

carbide single crystal substrate having a first main surface, a second main surface, and a first side end portion, the second main surface being opposite to the first main surface, the first side end portion connecting the first main surface and the second main surface to each other, the first main surface having a width with a maximum value of more than 100 mm. A silicon carbide epitaxial layer is formed in contact with the first side end portion, the first main surface, and a boundary between the first main surface and the first side end portion. The silicon carbide epitaxial layer formed in contact with the first side end portion and the boundary is removed.

16 Claims, 14 Drawing Sheets

(51) Int. Cl.

| | | |
|---|---|---|
| *C30B 25/20* | (2006.01) | |
| *C30B 29/36* | (2006.01) | |
| *H01L 21/02* | (2006.01) | |
| *C30B 25/18* | (2006.01) | |
| *H01L 29/06* | (2006.01) | |
| *H01L 29/16* | (2006.01) | |
| *H01L 21/3065* | (2006.01) | |
| *H01L 23/31* | (2006.01) | |
| *H01L 29/66* | (2006.01) | |
| *H01L 29/78* | (2006.01) | |
| *H01L 29/04* | (2006.01) | |

(52) U.S. Cl.
CPC ........ *C30B 29/36* (2013.01); *H01L 21/02164* (2013.01); *H01L 21/02271* (2013.01); *H01L 21/02378* (2013.01); *H01L 21/02598* (2013.01); *H01L 21/02636* (2013.01); *H01L 21/3065* (2013.01); *H01L 29/0657* (2013.01); *H01L 29/1608* (2013.01); *H01L 23/3185* (2013.01); *H01L 29/045* (2013.01); *H01L 29/66068* (2013.01); *H01L 29/7813* (2013.01); *H01L 2924/0002* (2013.01)

(58) Field of Classification Search
CPC ........ H01L 21/02271; H01L 21/02598; H01L 29/0657; H01L 29/1608; H01L 29/66068; H01L 29/7813; H01L 29/045; H01L 23/3185; C30B 29/36; C30B 25/18; C30B 25/20

See application file for complete search history.

(56) References Cited

U.S. PATENT DOCUMENTS

| | | | |
|---|---|---|---|
| 6,294,019 B1 | 9/2001 | Miura et al. | |
| 6,686,616 B1 | 2/2004 | Allen et al. | |
| 7,381,992 B2 * | 6/2008 | Ryu | H01L 21/049 |
| | | | 257/77 |
| 7,718,519 B2 * | 5/2010 | Takahashi | H01L 21/046 |
| | | | 257/E21.054 |
| 2004/0159865 A1 | 8/2004 | Allen et al. | |
| 2009/0186470 A1* | 7/2009 | Takahashi | H01L 21/046 |
| | | | 438/522 |
| 2009/0252942 A1 | 10/2009 | Kanaya et al. | |
| 2013/0026497 A1 | 1/2013 | Inoue et al. | |
| 2013/0112996 A1 | 5/2013 | Masuda | |
| 2013/0344775 A1* | 12/2013 | Sekiya | B24B 9/065 |
| | | | 451/44 |

FOREIGN PATENT DOCUMENTS

| | | |
|---|---|---|
| CN | 102664197 A | 9/2012 |
| CN | 102971853 A | 3/2013 |
| JP | H01-201922 A | 8/1989 |
| JP | H06-232057 A | 8/1994 |
| JP | H10-125633 A | 5/1998 |
| JP | H10-321487 A | 12/1998 |
| JP | 2002-508298 A | 3/2002 |
| JP | 2003-332183 A | 11/2003 |
| JP | 2004-253751 A | 9/2004 |
| JP | 2007-142326 A | 6/2007 |
| JP | 2010-064918 A | 3/2010 |
| JP | 2011-155057 A | 8/2011 |
| JP | 2011-219297 A | 11/2011 |
| JP | 2012-142485 A | 7/2012 |
| JP | 2012-160575 A | 8/2012 |
| JP | 2013-027960 A | 2/2013 |

OTHER PUBLICATIONS

International Search Report in PCT International Application No. PCT/JP2014/059825, dated Jun. 10, 2014.
Notice of Grounds of Rejection in counterpart Japanese Patent Application No. 2015-172825, dated Oct. 25, 2016.

* cited by examiner

SILICON CARBIDE SUBSTRATE, SILICON CARBIDE SEMICONDUCTOR DEVICE, AND METHODS FOR MANUFACTURING SILICON CARBIDE SUBSTRATE AND SILICON CARBIDE SEMICONDUCTOR DEVICE

TECHNICAL FIELD

The present invention relates to a silicon carbide substrate, a silicon carbide semiconductor device, and methods for manufacturing the silicon carbide substrate and the silicon carbide semiconductor device, in particular, the present invention relates to a silicon carbide substrate, a silicon carbide semiconductor device, and methods for manufacturing the silicon carbide substrate and the silicon carbide semiconductor device so as to achieve suppression of cracks in the silicon carbide substrate.

BACKGROUND ART

In recent years, in order to achieve high breakdown voltage, low loss, and utilization of semiconductor devices under a high temperature environment, silicon carbide has begun to be adopted as a material for a semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

A silicon carbide substrate is prepared by, for example, cutting a silicon carbide single crystal produced by a sublimation method and then chamfering a side surface portion thereof. For example, Japanese Patent Laying-Open No. 2010-64918 (Patent Document 1) describes that a silicon carbide epitaxial layer is formed on a silicon carbide single crystal wafer with a chamfered side surface portion of the silicon carbide substrate.

CITATION LIST

Patent Document

PTD 1: Japanese Patent Laying-Open No. 2010-64918

SUMMARY OF INVENTION

Technical Problem

However, when a silicon carbide semiconductor device is manufactured using a silicon carbide substrate having a silicon carbide epitaxial layer formed on a silicon carbide single crystal having been chamfered, a silicon dioxide layer formed on the silicon carbide substrate may be cracked.

The present invention has been made to solve such a problem, and has an object to provide a silicon carbide substrate, a silicon carbide semiconductor device, and methods for manufacturing the silicon carbide substrate and the silicon carbide semiconductor device so as to achieve suppression of cracks in a silicon dioxide layer formed on the silicon carbide substrate.

Solution to Problem

A method for manufacturing a silicon carbide substrate according to the present invention includes the following steps. There is prepared a silicon carbide single crystal substrate having a first main surface, a second main surface, and a first side end portion, the second main surface being opposite to the first main surface, the first side end portion connecting the first main surface and the second main surface to each other, the first main surface having a width with a maximum value of more than 100 mm. A silicon carbide epitaxial layer is formed in contact with the first side end portion, the first main surface, and a boundary between the first main surface and the first side end portion. The silicon carbide epitaxial layer formed in contact with the first side end portion and the boundary is removed.

A silicon carbide substrate according to the present invention includes a silicon carbide single crystal substrate and a silicon carbide epitaxial layer. The silicon carbide single crystal substrate has a first main surface, a second main surface, and a first side end portion, the second main surface being opposite to the first main surface, the first side end portion connecting the first main surface and the second main surface to each other, the first main surface having a width with a maximum value of more than 100 mm. The silicon carbide epitaxial layer in contact with a center of the first main surface includes a third main surface and a fourth main surface, the third main surface being in contact with the center of the first main surface, the fourth main surface being opposite to the third main surface. The fourth main surface has an outer circumferential end portion located closer to the center relative to a boundary between the first main surface and the first side end portion in a direction parallel to the first main surface.

Advantageous Effects of Invention

According to the present invention, there can be provided a silicon carbide substrate, a silicon carbide semiconductor device, and methods for manufacturing the silicon carbide substrate and the silicon carbide semiconductor device so as to achieve suppression of cracks in a silicon dioxide layer formed on the silicon carbide substrate.

DESCRIPTION OF EMBODIMENTS

Figure 1:
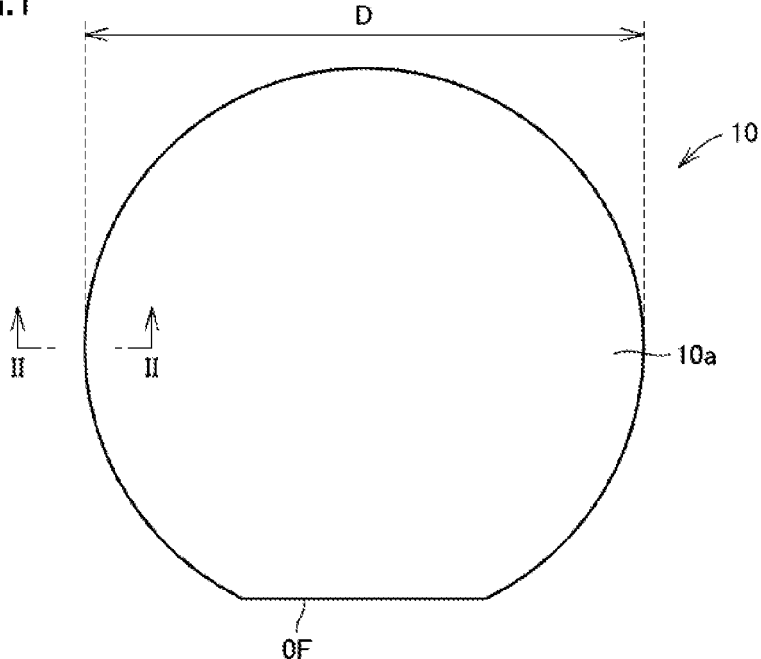
FIG. 1 is a schematic plan view schematically showing a structure of a silicon carbide substrate in a first embodiment of the present invention.

The following describes an embodiment of the present invention based on figures. It should be noted that in the below-described figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

First, the overview of embodiments of the present invention will be described with regard to (1) to (20) as follows.

As a result of diligent study about a cause of cracks in a silicon dioxide layer formed on a silicon carbide substrate, the inventors have obtained the following knowledge and arrived at the present invention. First, when a silicon carbide epitaxial layer is formed on a silicon carbide single crystal substrate, stepped portions are formed in an outer circumferential end portion of the silicon carbide epitaxial layer. Then, when a silicon dioxide layer is formed on the epitaxial layer, cracks are generated in the silicon dioxide layer across the surface of the silicon carbide substrate. When the size of the silicon carbide substrate is not more than 100 mm, substantially no crack is generated in the silicon dioxide layer, but particularly when the size of the silicon carbide substrate is more than 100 mm, cracks are remarkably generated in the silicon dioxide layer. Moreover, cracks are likely to be generated in the silicon dioxide layer when heating the silicon carbide substrate having the silicon dioxide layer or when attaching/detaching the silicon carbide substrate having the silicon dioxide layer to/from a chuck for holding a substrate. Furthermore, silicon carbide has a thermal expansion coefficient about 7 times as large as the thermal expansion coefficient of silicon dioxide. In comprehensive consideration of the matters above, one of causes of the cracks in the silicon dioxide layer is considered to be stress generated in the silicon dioxide layer due to a difference in thermal expansion coefficient between silicon dioxide and silicon carbide.

Moreover, it has been found that when fully inspecting the stepped portions formed in the outer circumferential end portion of the epitaxial layer, most of the stepped portions are formed to extend along a straight line obtained by rotating, in a main surface of the silicon carbide single crystal substrate in a range of ±20°, a straight line obtained by projecting a straight line parallel to a <11-20> direction onto the main surface of the silicon carbide single crystal substrate. Since cracks in a silicon dioxide layer extend in a direction in which the stepped portions extend, the cracks in the silicon dioxide layer are considered to be generated from the stepped portions as a starting point. Thus, it is considered that by removing the stepped portions formed in the outer circumferential end portion of the epitaxial layer, the cracks in the silicon dioxide layer can be suppressed.

(1) A method for manufacturing a silicon carbide substrate according to an embodiment includes the following steps. There is prepared a silicon carbide single crystal substrate 80 having a first main surface 80a, a second main surface 80b, and a first side end portion 80c, second main surface 80b being opposite to first main surface 80a, first side end portion 80c connecting first main surface 80a and second main surface 80b to each other, first main surface 80a having a width D with a maximum value of more than 100 mm. A silicon carbide epitaxial layer 81 is formed in contact with first side end portion 80c, first main surface 80a, and a boundary 80d between first main surface 80a and first side end portion 80c. Silicon carbide epitaxial layer 81 formed in contact with first side end portion 80c and boundary 80d is removed.

According to the method for manufacturing the silicon carbide substrate according to the embodiment, silicon carbide epitaxial layer 81 is formed in contact with first main surface 80a, having a width of more than 100 mm, of silicon carbide single crystal substrate 80, first side end portion 80c, and boundary 80d, and then silicon carbide epitaxial layer 81 formed in contact with first side end portion 80c and boundary 80d is removed. Accordingly, stepped portions 2 formed in first side end portion 80c and boundary 80d are removed, thereby suppressing generation of cracks in a silicon dioxide layer when the silicon dioxide layer is formed on silicon carbide substrate 10.

(2) Preferably in the method for manufacturing the silicon carbide substrate according to the embodiment, in the step of forming the silicon carbide epitaxial layer, silicon carbide epitaxial layer 81 is formed to have a stepped portion 2 on the boundary. In the step of removing the silicon carbide epitaxial layer, stepped portion 2 is removed. Accordingly, when a silicon dioxide layer is formed on silicon carbide substrate 10, cracks can be suppressed effectively from being generated in the silicon dioxide layer.

(3) Preferably in the method for manufacturing the silicon carbide substrate according to the embodiment, stepped portion 2 is formed to extend along a straight line obtained by rotating, in first main surface 80a in a range of ±20°, a straight line obtained by projecting a straight line parallel to a <11-20> direction onto first main surface 80a. It is considered that cracks are generated in a silicon dioxide layer particularly due to stepped portions 2 extending along the straight line obtained by rotating, in first main surface 80a in a range of ±20°, the straight line obtained by projecting the straight line parallel to the <11-20> direction onto first main surface 80a. Hence, by removing the stepped portions extending in the above-described direction, cracks can be suppressed more effectively from being generated in the silicon dioxide layer.

(4) Preferably in the method for manufacturing the silicon carbide substrate according to the embodiment, stepped portion 2 has a length L3 of not less than 50 μm and not more than 5000 μm in a direction from first side end portion 80c toward center 80p. It is considered that cracks are generated in a silicon dioxide layer particularly due to stepped portions 2 having a length of not less than 100 μm. Accordingly, by removing stepped portions 2 having the above-described length, cracks can be suppressed more effectively from being generated in the silicon dioxide layer.

(5) Preferably in the method for manufacturing the silicon carbide substrate according to the embodiment, stepped portion 2 has a depth H1 of not less than 1 μm and not more than 50 μm in a direction perpendicular to first main surface 80a. It is considered that cracks are generated in a silicon dioxide layer particularly due to stepped portions 2 having a depth of not less than 5 μm Depth H1 of stepped portions 2 tends to be increased in proportion to the thickness of the silicon carbide epitaxial layer, but depth H1 may become equal to or more than the thickness of the silicon carbide epitaxial layer or may become equal to or less than the thickness of the silicon carbide epitaxial layer. This depends on growth condition for the silicon carbide epitaxial layer and the shape of side end portion 81c (portion of length L2). Moreover, a relation between length L3 and depth H1 is as follows. Cracks are likely to be generated when length L3 is short and depth H1 is large and when length L3 is long and depth H1 is small. By removing the stepped portions having the above-described depth, cracks can be suppressed more effectively from being generated in the silicon dioxide layer.

(6) Preferably in the method for manufacturing the silicon carbide substrate according to the embodiment, silicon carbide epitaxial layer 81 has a thickness H2 of not less than 5 μm on a center 80p of first main surface 80a. Stepped portions 2, which are a cause of cracks in a silicon dioxide layer, are considered to be generated remarkably when the thickness of silicon carbide epitaxial layer 81 is not less than 5 μm. Accordingly, cracks can be suppressed more effectively from being generated in the silicon dioxide layer when the thickness of silicon carbide epitaxial layer 81 is not less than 5 μm.

(7) A method for manufacturing a silicon carbide semiconductor device according to an embodiment includes the following steps. There is prepared the silicon carbide substrate manufactured by the method recited in any one of (1) to (6). There is formed a silicon dioxide layer 61, 93 disposed to face a main surface 10a of silicon carbide epitaxial layer 81. Accordingly, cracks can be suppressed from being generated in silicon dioxide layer 61, 93 disposed to face main surface 10a of silicon carbide epitaxial layer 81.

(8) Preferably in the method for manufacturing the silicon carbide semiconductor device according to the embodiment, silicon dioxide layer 61 includes an ion implantation mask 61a Accordingly, cracks can be suppressed from being generated in ion implantation mask 61a.

(9) Preferably in the method for manufacturing the silicon carbide semiconductor device according to the embodiment, ion implantation mask 61a is in contact with first side end portion 80c of silicon carbide single crystal substrate 80. Since ion implantation mask 61a is formed in contact with first side end portion 80c from which stepped portion 2 has been removed, cracks can be suppressed from being generated in ion implantation mask 61a.

(10) Preferably in the method for manufacturing the silicon carbide semiconductor device according to the embodiment, silicon dioxide layer 93 includes an interlayer insulating film 93. Accordingly, cracks can be suppressed from being generated in interlayer insulating film 93.

(11) Preferably in the method for manufacturing the silicon carbide semiconductor device according to the embodiment, silicon dioxide layer 61, 93 has a thickness H3 of not less than 0.8 μm and not more than 20 μm. Accordingly, also when thickness H3 of silicon dioxide layer 61, 93 is not less than 0.8 μm and not more than 20 μm, cracks can be suppressed from being generated in silicon dioxide layer 61, 93.

(12) Preferably, the method for manufacturing the silicon carbide semiconductor device according to the embodiment further includes a step of annealing silicon carbide substrate 10 and silicon dioxide layer 61, 93 after the step of forming the silicon dioxide layer. Accordingly, also when silicon carbide substrate 10 and silicon dioxide layer 61, 93 are annealed, cracks can be suppressed from being generated in silicon dioxide layer 61, 93.

(13) A silicon carbide substrate according to an embodiment includes a silicon carbide single crystal substrate 80 and a silicon carbide epitaxial layer 81. Silicon carbide single crystal substrate 80 has a first main surface 80a, a second main surface 80b, and a first side end portion 80c, second main surface 80b being opposite to the first main surface, first side end portion 80c connecting first main surface 80a and second main surface 80b to each other, first main surface 80a having a width D with a maximum value of more than 100 mm. Silicon carbide epitaxial layer 81 in contact with a center 80p of first main surface 80a includes a third main surface 10b and a fourth main surface 10a, third main surface 10b being in contact with center 80p of first main surface 80a, fourth main surface 10a being opposite to third main surface 10b. Fourth main surface 10a has an outer circumferential end portion 81e located closer to center 80p relative to a boundary 80d between first main surface 80a and first side end portion 80c in a direction parallel to first main surface 80a.

According to the silicon carbide substrate according to the embodiment, outer circumferential end portion 81e of fourth main surface 10a of silicon carbide epitaxial layer 81 in contact with center 80p of first main surface 80a, having a width of more than 100 mm, of silicon carbide single crystal substrate 80 is located closer to center 80p relative to boundary 80d between first main surface 80a and first side end portion 80c in the direction parallel to first main surface 80a. Accordingly, there can be obtained silicon carbide substrate 10 from which stepped portions 2 on boundary 80d have been removed. Accordingly, cracks can be suppressed from being generated in a silicon dioxide layer when the silicon dioxide layer is formed on silicon carbide substrate 10.

(14) Preferably in the silicon carbide substrate according to the embodiment, third main surface 10b has an outer circumferential end portion 81t located closer to center 80p relative to boundary 80d between first main surface 80a and first side end portion 80c in the direction parallel to first main surface 80a. Accordingly, there can be obtained silicon carbide substrate 10 from which silicon carbide epitaxial layer 81 on boundary 80d have been removed. Accordingly, cracks can be suppressed from being generated in a silicon dioxide layer when the silicon dioxide layer is formed on silicon carbide substrate 10.

(15) Preferably in the silicon carbide substrate according to the embodiment, silicon carbide epitaxial layer 81 includes a second side end portion 81c connecting third main surface 10b and fourth main surface 10a to each other. When viewed in a cross section, second side end portion 81c is formed to have a curvature in conformity with first side end portion 80c. Accordingly, there can be obtained silicon carbide substrate 10 from which stepped portions 2 on boundary 80d have been removed. Accordingly, cracks can be suppressed from being generated in a silicon dioxide layer when the silicon dioxide layer is formed on silicon carbide substrate 10.

(16) Preferably in the silicon carbide substrate according to the embodiment, a distance L1 from outer circumferential end portion 81e of fourth main surface 10a to boundary 80d in the direction parallel to first main surface 80a is not less than 10 μm and not more than 5000 μm. Accordingly, there can be obtained silicon carbide substrate 10 from which stepped portions 2 on boundary 80d have been removed effectively. Accordingly, cracks can be suppressed from being generated in a silicon dioxide layer when the silicon dioxide layer is formed on silicon carbide substrate 10.

(17) Preferably in the silicon carbide substrate according to the embodiment, silicon carbide epitaxial layer 81 has a thickness H2 of not less than 5 μm on center 80p of first main surface 80a. Stepped portions 2, which are a cause of cracks in a silicon dioxide layer, is considered to be generated remarkably when the thickness of silicon carbide epitaxial layer 81 is not less than 5 μm. Accordingly, cracks can be suppressed more effectively from being generated in the silicon dioxide layer when the thickness of silicon carbide epitaxial layer 81 is not less than 5 μm.

(18) A silicon carbide semiconductor device according to an embodiment includes: silicon carbide substrate 10 recited in any one of (12) to (14); and a silicon dioxide layer 93 disposed to face silicon carbide epitaxial layer 81. Accordingly, cracks can be suppressed in silicon dioxide layer 93 of the silicon carbide semiconductor device.

(19) Preferably in the silicon carbide semiconductor device according to the embodiment, silicon dioxide layer 93 is an interlayer insulating film 93. Accordingly, cracks can be suppressed in the interlayer insulating film of the silicon carbide semiconductor device.

(20) Preferably in the silicon carbide semiconductor device according to the embodiment, silicon dioxide layer 93 has a thickness H3 of not less than 0.8 μm and not more than 20 μm. Also when thickness H3 of silicon dioxide layer 93 is not less than 0.8 μm and not more than 20 μm, cracks can be suppressed from being generated in silicon dioxide layer 93.

Next, the embodiments of the present invention will be described more in detail.

First Embodiment

Figure 2:
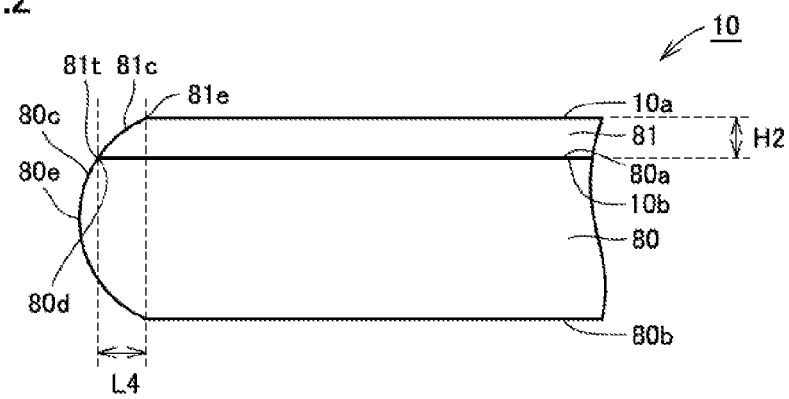
FIG. 2 is a schematic cross sectional view schematically showing the structure of the silicon carbide substrate in the first embodiment of the present invention.

With reference to FIG. 1 and FIG. 2, the following describes a configuration of a silicon carbide substrate 10 according to a first embodiment. Silicon carbide substrate 10 according to the first embodiment mainly includes a silicon carbide single crystal substrate 80 and a silicon carbide epitaxial layer 81. For example, silicon carbide single crystal substrate 80 is made of hexagonal silicon carbide of polytype 4H, for example. Silicon carbide single crystal substrate 80 includes an impurity element such as nitrogen, and has n type conductivity (first conductivity type). The impurity such as nitrogen in silicon carbide single crystal substrate 80 has a concentration of, for example, about not less than $1\times10^{18}$ cm$^{-3}$ and about not more than $1\times10^{19}$ cm$^{-3}$. Silicon carbide single crystal substrate 80 includes: a first main surface 80a; a second main surface 80b opposite to first main surface 80a; a first side end portion 80c that connects first main surface 80a and second main surface 80b to each other; a boundary 80d between first side end portion 80c and first main surface 80a; and an outermost circumferential portion 80e. First side end portion 80c is a chamfered surface, and is a portion having a curvature to project in the outer circumferential direction when viewed in a cross section (field of view in a direction parallel to the first main surface). First main surface 80a may correspond to, for example, a {0001} plane, a plane angled off by about not more than 10° relative to the {000} plane, or a plane angled off by about not more than 0.25° relative to the {000} plane. In other words, first main surface 80a may correspond to, for example, a (0001) plane or a (000-1) plane, a plane angled off by about not more than 10° relative to the (0001) plane or the (000-1) plane, or a plane angled off by about not more than 0.25° relative to the (0001) plane or the (000-1) plane.

Silicon carbide epitaxial layer 81 is provided on and in contact with first main surface 80a of silicon carbide single crystal substrate 80. Silicon carbide epitaxial layer 81 has a thickness of about not less than 5 μm and not more than 40 μm, for example. Silicon carbide epitaxial layer 81 includes an impurity element such as nitrogen, and has n type conductivity. The impurity concentration of silicon carbide epitaxial layer 81 may be lower than the impurity concentration of silicon carbide single crystal substrate 80. The impurity concentration of silicon carbide epitaxial layer 81 is, for example, about not less than $1\times10^{15}$ cm$^{-3}$ and about not more than $1\times10^{16}$ cm$^{-3}$. Silicon carbide epitaxial layer 81 includes: a third main surface 10b in contact with first main surface 80a; a fourth main surface 10a opposite to third main surface 10b; a second side end portion 81c that connects third main surface 10b and fourth main surface 10a to each other; an outer circumferential end portion 81e of fourth main surface 10a; and an outer circumferential end portion 81t of third main surface 10b.

With reference to FIG. 1, when viewed in a plan view (field of view in a direction normal to fourth main surface 10a), the maximum value of width D of fourth main surface 10a of silicon carbide single crystal substrate 80 of silicon carbide substrate 10 is larger than 100 mm. Preferably, the maximum value of width D of fourth main surface 10a is not less than 150 mm. Silicon carbide substrate 10 has a substantially circular shape. Silicon carbide substrate 10 may have an orientation flat portion OF.

With reference to FIG. 2, silicon carbide epitaxial layer 81 includes: third main surface 10b in contact with center 80p of first main surface 80a; and fourth main surface 10a opposite to third main surface 10b. When viewed in a cross section, outer circumferential end portion 81e of fourth main surface 10a is located closer to center 80p (see FIG. 4) relative to boundary 80d between first main surface 80a and first side end portion 80c in the direction parallel to first main surface 80a. Boundary 80d between first main surface 80a and first side end portion 80c may be an inflection point of a line that connects first main surface 80a and first side end portion 80c to each other. Silicon carbide epitaxial layer 81 includes second side end portion 81c that connects third main surface 10b and fourth main surface 10a to each other. Outer circumferential end portion 81e of fourth main surface 10a may be an inflection point of a line that connects fourth main surface 10a and second side end portion 81c to each other. When viewed in a cross section, second side end portion 81c of silicon carbide epitaxial layer 81 is formed to have a curvature to project in the outer circumferential direction, and is formed in conformity with first side end portion 80c of silicon carbide single crystal substrate 80. Preferably, when viewed in a cross section, second side end portion 81c has a radius of curvature substantially the same as that of first side end portion 80c.

Silicon carbide epitaxial layer 81 on boundary 80d between first main surface 80a and first side end portion 80c has a thickness of substantially 0, and silicon carbide epitaxial layer 81 on center 80p (see FIG. 4) of first main surface 80a has a thickness H2 of not less than 5 μm, for example. Moreover, outer circumferential end portion 81t of third main surface 10b of epitaxial layer 81 is located at boundary 80d between first main surface 80a and first side end portion 80c of silicon carbide single crystal substrate 80. Preferably, when viewed in a cross section, outermost circumferential portion 80e of silicon carbide single crystal substrate 80 is located closer to first main surface 80a relative to an intermediate position between first main surface 80a and second main surface 80b. Preferably, a distance L4 from outer circumferential end portion 81e of fourth main surface 10a to boundary 80d in the direction parallel to first main surface 80a is not less than 50 μm and not more than 1000 μm. Moreover, the side end portion of silicon carbide substrate 10 may have a shape unsymmetrical or symmetrical between the fourth main surface 10a side and the second main surface 80b side.

Figure 3:
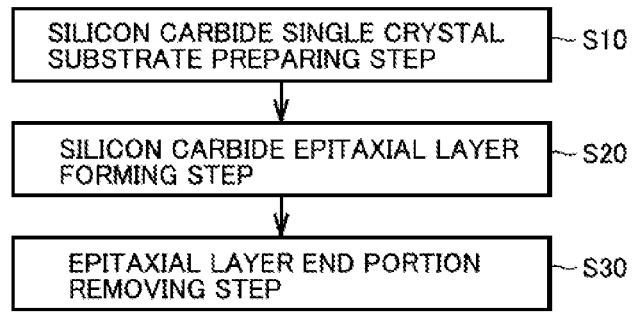
FIG. 3 is a flowchart schematically showing a method for manufacturing the silicon carbide substrate in the first embodiment of the present invention.

Next, with reference to FIG. 3, the following describes a method for manufacturing silicon carbide substrate 10 according to the first embodiment. First, a silicon carbide single crystal substrate preparing step (S10: FIG. 3) is performed. Specifically, with reference to FIG. 4 and FIG. 5, silicon carbide single crystal substrate 80 having n type conductivity is prepared by, for example, slicing an ingot (not shown) made of single crystal silicon carbide of polytype of 4H. Silicon carbide single crystal substrate 80 includes an impurity such as nitrogen, for example. The concentration of the impurity such as nitrogen in silicon carbide single crystal substrate 80 is, for example, about not less than $1\times10^{18}$ cm$^{-3}$ and about not more than $1\times10^{19}$ cm$^{-3}$. Silicon carbide single crystal substrate 80 includes: first main surface 80a; second main surface 80b opposite to first main surface 80a; first side end portion 80c that connects first main surface 80a and second main surface 80b to each other; boundary 80d between first side end portion 80c and first main surface 80a; and outermost circumferential portion 80e.

Figure 4:
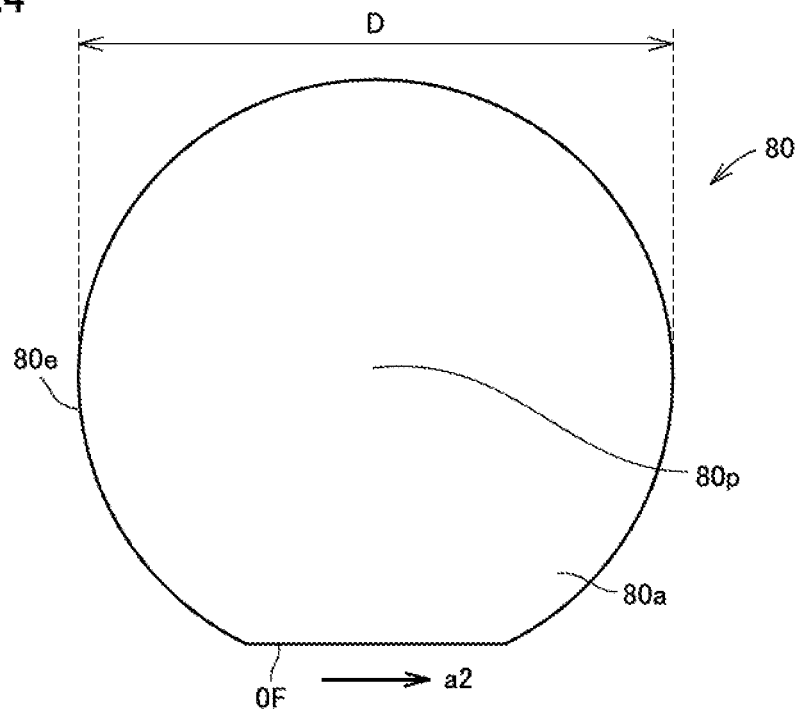
FIG. 4 is a schematic plan view schematically showing a first step of the method for manufacturing the silicon carbide substrate in the first embodiment of the present invention.
Figure 5:
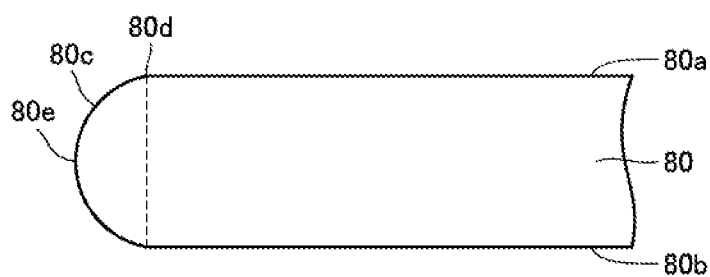
FIG. 5 is a schematic cross sectional view schematically showing the first step of the method for manufacturing the silicon carbide substrate in the first embodiment of the present invention.

With reference to FIG. 4, when viewed in a plan view, silicon carbide single crystal substrate 80 has center 80p of first main surface 80a. When first main surface 80a is a circle, center 80p is the center of the circle. When the first main surface is not a circle, center 80p is an intersection between first main surface 80a and a line parallel to the normal line of first main surface 80a and passing through the center of gravity of silicon carbide single crystal substrate 80. First main surface 80a may correspond to, for example, the {0001} plane, a plane angled off by about not more than 10° relative to the {0001} plane, or a plane angled off by about not more than 0.25° relative to the {0001} plane. The maximum value of width D of first main surface 80a of silicon carbide single crystal substrate 80 is larger than 100 mm. Preferably, the maximum value of width D of first main surface 80a is not less than 150 mm.

Figure 31:
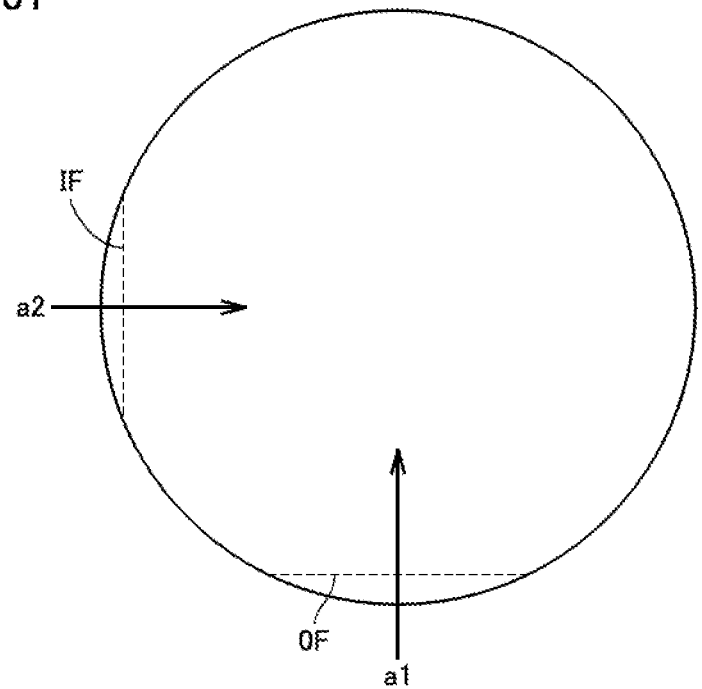
FIG. 31 is a schematic plan view schematically showing positions of an orientation flat portion OF and an index flat portion IF when a fourth surface of the silicon carbide single crystal substrate corresponds to a (0001) plane.
Figure 32:
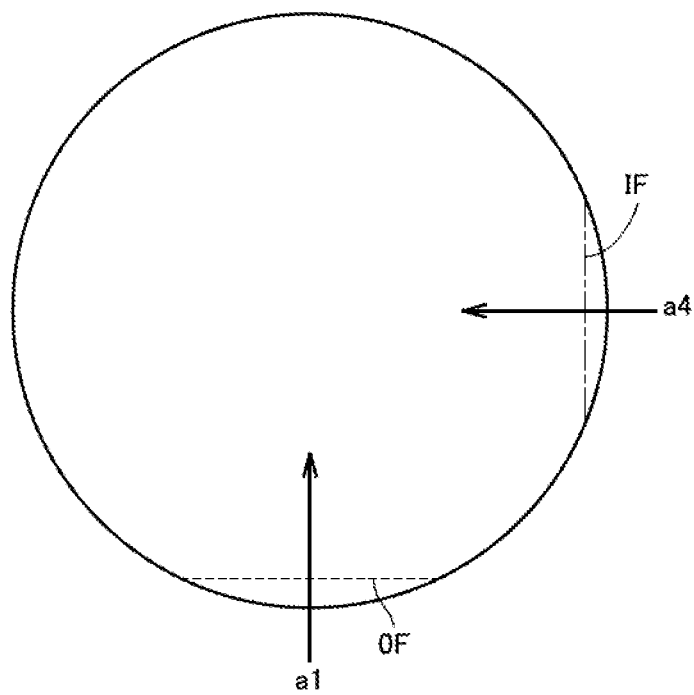
FIG. 32 is a schematic plan view schematically showing positions of an orientation flat portion OF and an index flat portion IF when a fourth surface of the silicon carbide single crystal substrate corresponds to a (000-1) plane.

More specifically, with reference to FIG. 31, first main surface 80a of silicon carbide single crystal substrate 80 may correspond to, for example, the (0001) plane, a plane angled off by about not more than 10° relative to the (0001) plane, or a plane angled off by about not more than 0.25° relative to the (0001) plane. The (0001) plane is also referred to as "Si plane". When first main surface 80a corresponds to the (0001) plane, a direction a1 perpendicular to the direction in which orientation flat portion OF extends is a <1-100> direction, more particularly, is a [1-100] direction. A direction a2 perpendicular to the direction in which an index flat portion IF extends is a <11-20> direction, more particularly, a [11-20] direction. Moreover, with reference to FIG. 32, for example, first main surface 80a of silicon carbide single crystal substrate 80 may correspond to the (000-1) plane, a plane angled off by about not more than 10° relative to the (000-1) plane, or a plane angled off by about not more than 0.25° relative to the (000-1) plane. The (000-1) plane is also referred to as "C plane". When first main surface 80a corresponds to the (000-1) plane, direction a1 perpendicular to the direction in which orientation flat portion OF extends is the <1-100> direction, more particularly, the [1-100] direction. A direction a4 perpendicular to the direction in which index flat portion IF extends is the <11-20> direction, more particularly, is the [11-20] direction.

Figure 6:
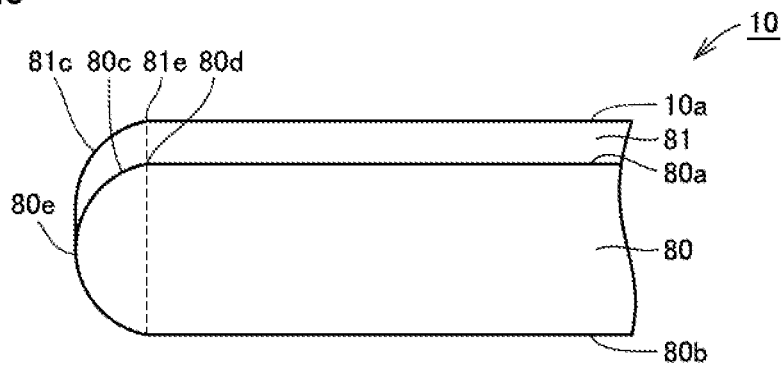
FIG. 6 is a schematic cross sectional view schematically showing a second step of the method for manufacturing the silicon carbide substrate in the first embodiment of the present invention.

Next, a silicon carbide epitaxial layer forming step (S20: FIG. 3) is performed. Specifically, with reference to FIG. 6, silicon carbide epitaxial layer 81 is formed by, for example, a CVD (Chemical Vapor Deposition) method in contact with first main surface 80a and first side end portion 80c of silicon carbide single crystal substrate 80. Silicon carbide epitaxial layer 81 includes: third main surface 10b in contact with first main surface 80a; fourth main surface 10a opposite to third main surface 10b; second side end portion 81c that connects third main surface 10b and fourth main surface 10a to each other; and outer circumferential end portion 81e between second side end portion 81c and fourth main surface 10a.

More specifically, silicon carbide single crystal substrate 80 is first placed in a chamber, and then the silicon carbide single crystal substrate is heated to a temperature of not less than 1500° C. and not more than 1700° C., for example. Then, silicon carbide source material gas is introduced into the chamber. The silicon carbide source material gas is gas including silane, propane, nitrogen, and ammonia, for example. Accordingly, silicon carbide epitaxial layer 81 is formed in contact with first main surface 80a of silicon carbide single crystal substrate 80, first side end portion 80c, and boundary 80d between first main surface 80a and first side end portion 80c.

Figure 7A:
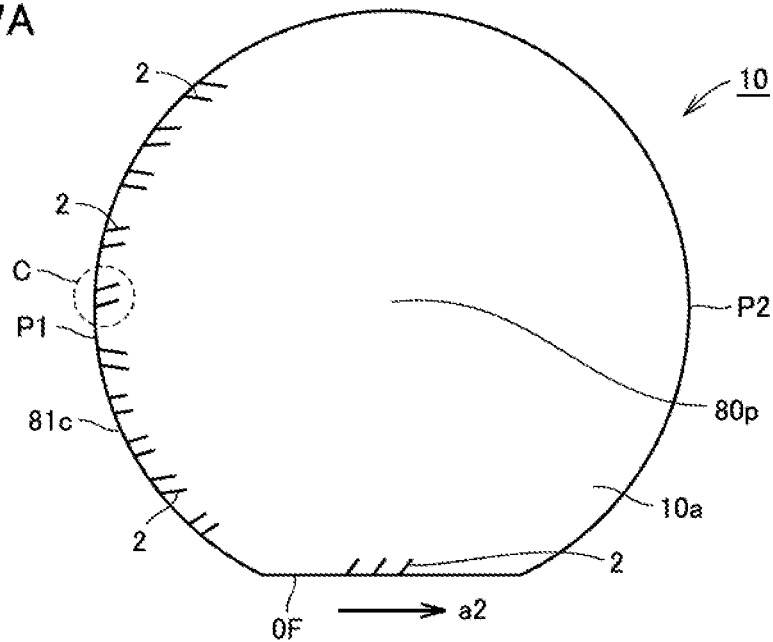
FIG. 7A is a schematic plan view schematically showing a first example of the second step of the method for manufacturing the silicon carbide substrate in the first embodiment of the present invention.

With reference to FIG. 7A, when viewed in a plan view, a plurality of stepped portions 2 are formed in the vicinity of side end portion 81i of fourth main surface 10a of epitaxial layer 81. Stepped portions 2 are formed to extend in a direction from side end portion 81c toward center 80p of silicon carbide single crystal substrate 80. Typically, stepped portions 2 are mainly formed at the orientation flat portion OF side of fourth main surface 10a in the lower side of the figure and at the first portion P1 side of fourth main surface 10a in the left side of the figure, and substantially no stepped portions 2 are formed at the second portion P2 side opposite to first portion P1. It should be noted that when fourth main surface 10a corresponds to the (0001) plane, first portion P1 is index flat portion IF, and when the fourth main surface corresponds to the (000-1) plane, second portion P2 is index flat portion IF. In the case where fourth main surface 10a corresponds to either of the (0001) plane and the (000-1) plane, a larger number of stepped portions 2 are formed at the first portion P1 side than those at the second portion P2 side.

Figure 7B:
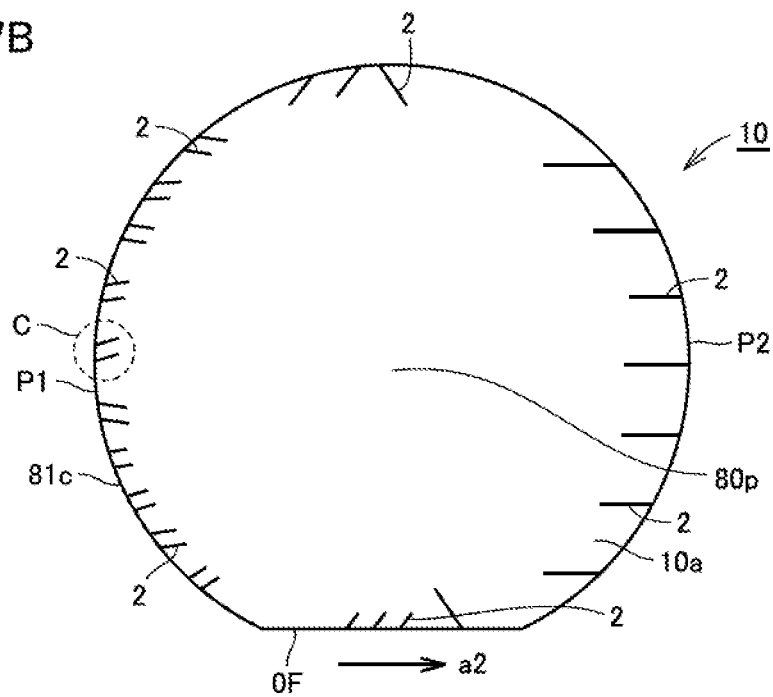
FIG. 7B is a schematic plan view schematically showing a second example of the second step of the method for manufacturing the silicon carbide substrate in the first embodiment of the present invention.

Moreover, with reference to FIG. 7B, stepped portions 2 may be formed at the orientation flat portion OF side of fourth main surface 10a in the lower side of the figure, the side opposite to orientation flat portion OF, the first portion P1 side of fourth main surface 10a in the left side of the figure, and the second portion P2 side opposite to first portion P1. In this case, the average length of stepped portions 2 formed at the second portion P2 side may be longer than the average length of stepped portions 2 formed at the first portion P1 side. Moreover, the number of stepped portions 2 formed at the second portion P2 side may be smaller than the number of stepped portions 2 formed at the first portion P1 side. Furthermore, in addition to stepped portions 2 extending in the <11-20> direction, stepped portions 2 may be formed to extend in the <1-100> direction. As with the case of FIG. 7A, when fourth main surface 10a corresponds to the (0001) plane, first portion P1 is index flat portion IF, and when the fourth main surface corresponds to the (000-1) plane, second portion P2 is index flat portion IF.

Figure 8:
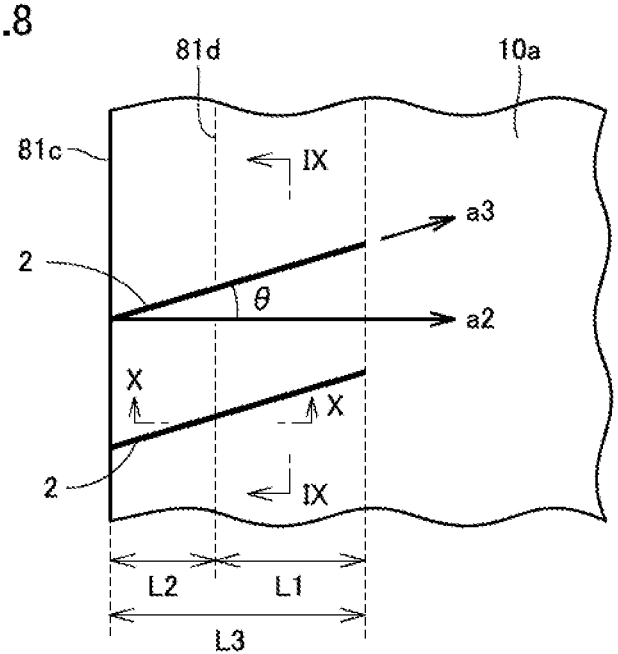
FIG. 8 is an enlarged schematic plan view of a region C in FIG. 7.
Figure 9:
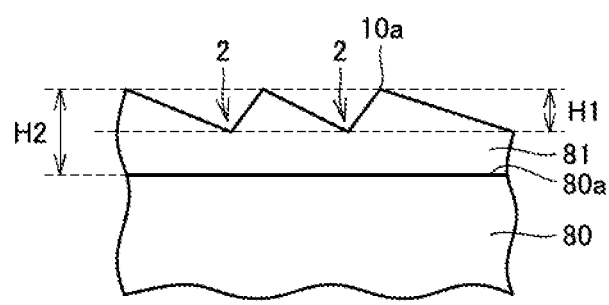
FIG. 9 is a schematic cross sectional view of a region IX-IX in FIG. 8.
Figure 10:
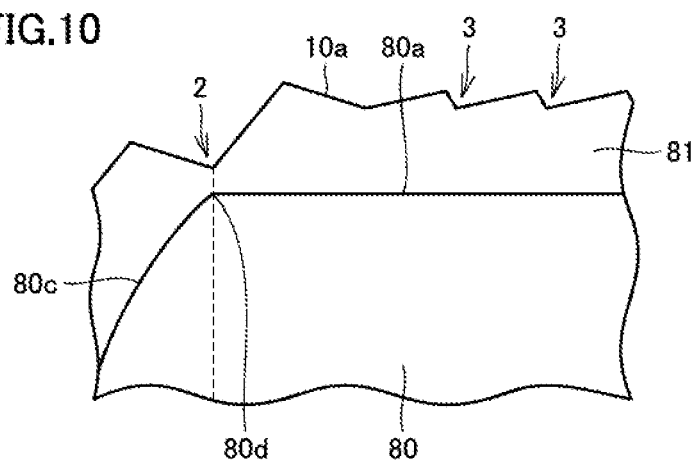
FIG. 10 is a schematic cross sectional view of a region X-X in FIG. 8.

With reference to FIG. 8 to FIG. 10, the following describes details of stepped portions 2. As shown in FIG. 8, when fourth main surface 10a corresponds to the {0001} plane, stepped portions 2 are formed to extend from second side end portion 81c in a direction falling within a range of 0.20° relative to the <11-20> direction in fourth main surface 10a In other words, assuming that an angle θ represents an angle formed in fourth main surface 10a between extension direction a3 of stepped portions 2 and direction a2 in which orientation flat portion OF extends, angle θ is in a range of not less than −20° and not more than 200. It should be noted that regarding positive/negative values of the angle, it can be assumed that an angle of a positive value indicates that a stepped portion 2 is inclined toward the <1-100> direction relative to the <11-20> direction. Stepped portion 2 has a length of, for example, not less than 50 μm and not more than 5000 μm in the direction from first side end portion 80c toward center 80p of silicon carbide single crystal substrate 80. A ratio obtained by dividing length L3 of stepped portion 2 by the maximum value of the width of first main surface 80a is not less than 0.03% and not more than 5%. A distance L2 is 150 μm from the outer circumferential end of second side end portion 81c of silicon carbide single crystal substrate 80 to boundary 81d, for example. A distance L1 is 200 μm from boundary 81d to the termination of stepped portion 2 in direction a2 parallel to the direction in which the orientation flat portion extends, for example. Distance L1 is, for example, not less than 200 μm and not more than 1000 μm, and is preferably not less than 300 μm and not more than 600 μm. Length L3 of stepped portion 2 in the direction from first side end portion 80c toward center 80p is not less than 50 μm and not more than 5000 μm, for example.

With reference to FIG. 9, stepped portion 2 is a crack having an opening in fourth main surface 10a of silicon carbide epitaxial layer 81, and may have a bottom portion formed in silicon carbide epitaxial layer 81. A depth H1 from the outermost surface of fourth main surface 10a to the bottom portion of stepped portion 2 (i.e., depth H1 of stepped portion 2 in the direction perpendicular to first main surface 80a) is, for example, not less than 1 μm and not more than 50 μm.

With reference to FIG. 8 and FIG. 10, stepped portions 2 are formed above first side end portion 80c of silicon carbide single crystal substrate 80, above first main surface 80a, and above boundary 80d between first side end portion 80c and first main surface 80a. In fourth main surface 10a of silicon carbide epitaxial layer 81 formed on first main surface 80a, steps 3 resulting from step-flow growth are formed. Stepped portion 2 may be a step bunching. A step 3 resulting from step-flow growth has a typical value of about 1 nm to 10 nm whereas a step in stepped portion 2 is about 1 μm to 50 μm. Stepped portion 2 may be formed to extend from a portion of silicon carbide epitaxial layer 81 formed on first side end portion 80c having an exposed surface having a plurality of plane orientations to a portion of silicon carbide epitaxial layer 81 formed on the first main surface.

Figure 11:
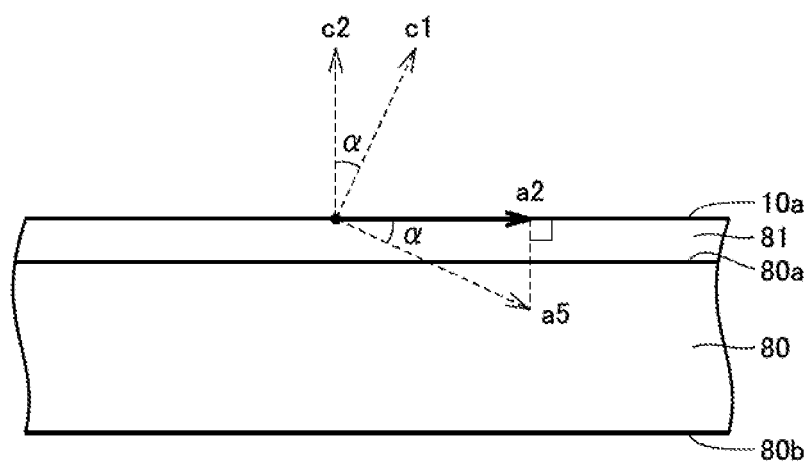
FIG. 11 is a schematic cross sectional view schematically showing the structure of the silicon carbide substrate in the first embodiment of the present invention.

With reference to FIG. 11, assume that fourth main surface 10a of silicon carbide epitaxial layer 81 corresponds to a plane angled off by an angle α relative to the {0001} plane in the <11-20> direction. Here, it is assumed that a c1 direction is the <0001> direction and an a5 direction is the <11-20> direction. In this case, direction a2 is a direction a2 along a straight line obtained by projecting, onto fourth main surface 10a, a straight line parallel to the <11-20> direction. As shown in FIG. 8, direction a3 in which stepped portion 2 extends in fourth main surface 10a is a direction along a straight line obtained by rotating, in fourth main surface 10a by an angle θ falling within a range of ±20°, a straight line obtained by projecting a straight line parallel to the <11-20> direction onto fourth main surface 10a. Here, a c2 direction is the normal direction of fourth main surface 10a. It should be noted that when angle α (off angle) is 0°, the a2 direction is the <11-20> direction.

Figure 12:
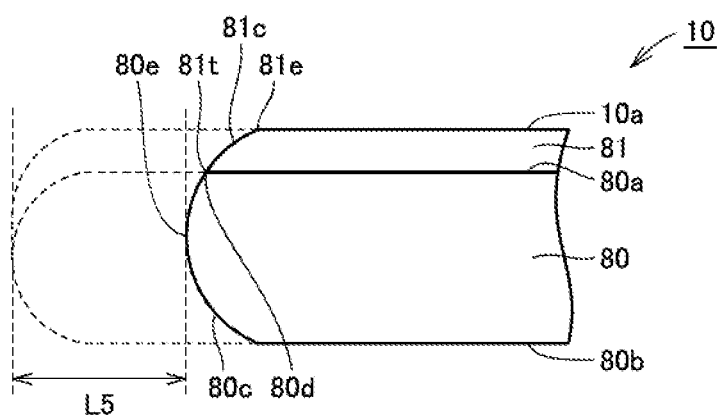
FIG. 12 is a schematic cross sectional view schematically showing a third step of the method for manufacturing the silicon carbide substrate in the first embodiment of the present invention.

Next, an epitaxial layer end portion removing step (S30: FIG. 3) is performed. Specifically, with reference to FIG. 12, first side end portion 80c of silicon carbide single crystal substrate 80 and second side end portion 81c of silicon carbide epitaxial layer 81 are removed by, for example, polishing or the like, thereby removing silicon carbide epitaxial layer 81 formed in contact with first side end portion 80c and boundary 80d. Accordingly, stepped portions 2 are removed from fourth main surface 10a of silicon carbide epitaxial layer 81. In FIG. 12, a portion indicated by a broken line represents the shape of silicon carbide substrate 10 before polishing, and a portion indicated by a solid line is the shape of silicon carbide substrate 10 after polishing. Preferably, first side end portion 80c of silicon carbide single crystal substrate 80 and second side end portion 81c of silicon carbide epitaxial layer 81 are simultaneously polished in the direction parallel to first main surface 80a, thereby removing stepped portions 2. An amount L5 of polishing of each of silicon carbide single crystal substrate 80 and silicon carbide epitaxial layer 81 is about not less than 50 μm and not more than 1000 μm, for example.

Figure 15:
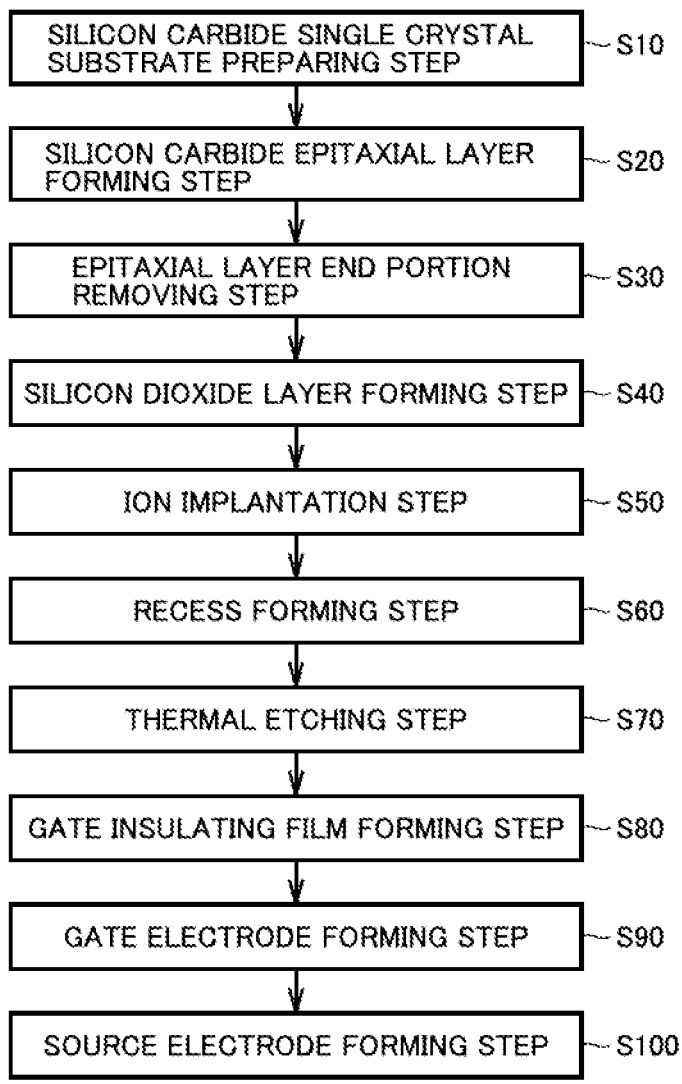
FIG. 15 is a flowchart schematically showing the method for manufacturing the silicon carbide semiconductor device in the second embodiment of the present invention.
Figure 16:
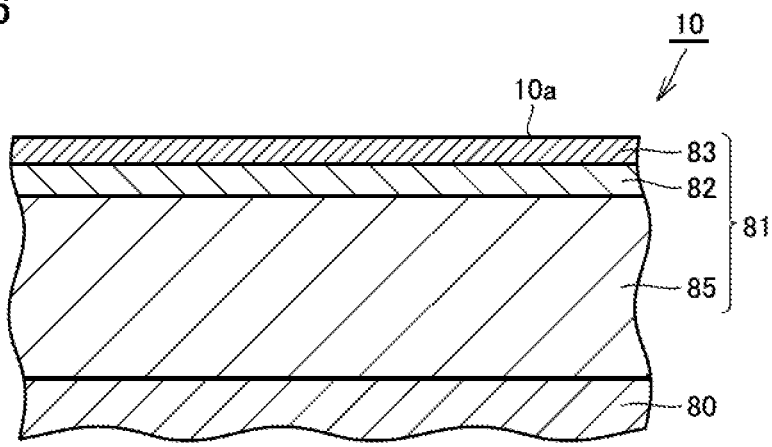
FIG. 16 is a schematic cross sectional view schematically showing a first step of the method for manufacturing the silicon carbide semiconductor device in the second embodiment of the present invention.
Figure 17:
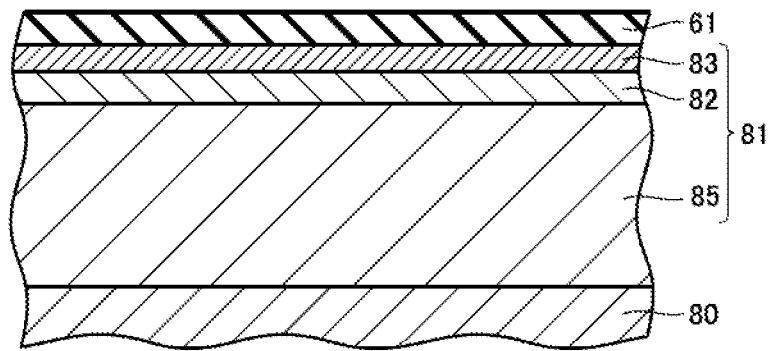
FIG. 17 is a schematic cross sectional view schematically showing a second step of the method for manufacturing the silicon carbide semiconductor device in the second embodiment of the present invention.
Figure 18:
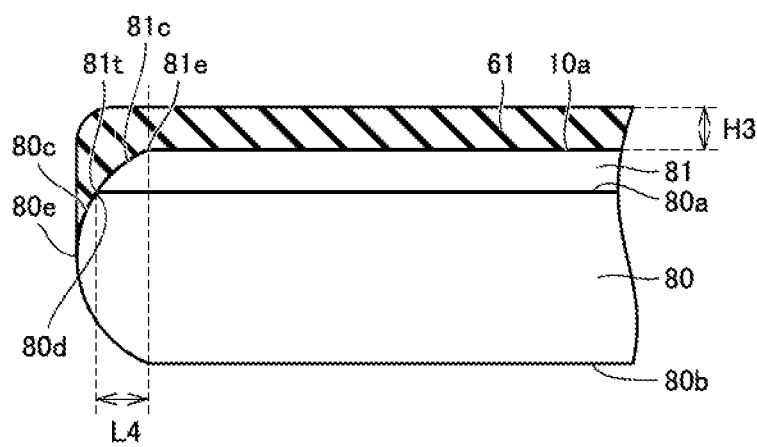
FIG. 18 is an enlarged schematic cross sectional view schematically showing an end portion of the silicon carbide semiconductor device in the second step of the method for manufacturing the silicon carbide semiconductor device in the second embodiment of the present invention.

Stepped portions 2 may be removed by means of chamfering or edge polishing for example. Conditions for the chamfering are, for example, as follows. That is, the end portion of the substrate is chamfered by pressing the end surface of the substrate against a desirably shaped groove portion arranged in a layer-type grindstone and rotating the substrate and the grindstone relative to each other. In the layer-type grindstone, a type of abrasive grains is diamond or CBN (cubic boron nitride), the abrasive grain number is No. 400 to No. 2500, and a binder is one of metal, electrodeposition, and resin. Conditions for the edge polishing are, for example, as follows. The end surface of the substrate is polished by pressing the end portion of the substrate against a grindstone in which a type of abrasive grains is diamond or CBN, the abrasive grain number is No. 1000 to No. 10000, and a binder is one of metal, electrodeposition, resin, and hard rubber. It should be noted that stepped portions 2 are removed before a silicon dioxide layer forming step (S40: FIG. 15) described later.

The following describes function and effect of silicon carbide substrate 10 according to the first embodiment.

According to the method for manufacturing the silicon carbide substrate according to the embodiment, silicon carbide epitaxial layer 81 is formed in contact with first main surface 80a, having a width of more than 100 mm, of silicon carbide single crystal substrate 80, first side end portion 80c, and boundary 80d, and then silicon carbide epitaxial layer 81 formed in contact with first side end portion 80c and boundary 80d is removed. Accordingly, stepped portions 2 formed in first side end portion 80c and boundary 80d are removed, thereby suppressing cracks from being generated in a silicon dioxide layer when the silicon dioxide layer is formed on silicon carbide substrate 10.

Moreover, according to the method for manufacturing silicon carbide substrate 10 according to the first embodiment, in the step of forming the silicon carbide epitaxial layer, silicon carbide epitaxial layer 81 having stepped portions 2 on the boundary is formed. In the step of removing the silicon carbide epitaxial layer, stepped portions 2 are removed. Accordingly, when a silicon dioxide layer is formed on the silicon carbide substrate, cracks can be suppressed effectively from being generated in the silicon dioxide layer.

Further, according to the method for manufacturing silicon carbide substrate 10 according to the first embodiment, stepped portions 2 are formed to extend along the straight line obtained by rotating, in first main surface 80a in a range of 0.20°, the straight line obtained by projecting the straight line parallel to the <11-20> direction onto first main surface 80a. It is considered that cracks in a silicon dioxide layer are generated particularly due to stepped portions 2 extending along the straight line obtained by rotating, in first main surface 80a in a range of ±20°, the straight line obtained by projecting the straight line parallel to the <11-20> direction onto first main surface 80a. Hence, by removing the stepped portions extending in the above-described direction, cracks can be suppressed more effectively from being generated in the silicon dioxide layer.

Further, according to the method for manufacturing silicon carbide substrate 10 according to the first embodiment, length L3 of each stepped portion 2 in the direction from first side end portion 80c toward center 80p is not less than 50 μm and not more than 5000 μm. It is considered that cracks are generated in a silicon dioxide layer particularly due to stepped portions having a length of not less than 100 μm. Hence, by removing stepped portions 2 having the above-described length, cracks can be suppressed more effectively from being generated in the silicon dioxide layer.

Further, according to the method for manufacturing silicon carbide substrate 10 according to the first embodiment, depth H1 of stepped portion 2 in the direction perpendicular to first main surface 80a is not less than 1 μm and not more than 50 μm. It is considered that cracks are generated in a silicon dioxide layer particularly due to stepped portions having a depth of not less than 5 μm. Accordingly, by removing the stepped portions having the above-described depth, cracks can be suppressed more effectively from being generated in the silicon dioxide layer.

Further, according to the method for manufacturing silicon carbide substrate 10 according to the first embodiment, thickness 112 of silicon carbide epitaxial layer 81 on center 80p of first main surface 80a is not less than 5 µm. Stepped portions 2, which are a cause of cracks in a silicon dioxide layer, are considered to be generated remarkably when the thickness of silicon carbide epitaxial layer 81 is not less than 5 µm. Accordingly, cracks can be suppressed more effectively from being generated in the silicon dioxide layer when the thickness of silicon carbide epitaxial layer 81 is not less than 5 µm.

According to silicon carbide substrate 10 according to the first embodiment, outer circumferential end portion 81e of fourth main surface 10a of silicon carbide epitaxial layer 81 in contact with center 80p of first main surface 80a, having a width of more than 100 mm, of silicon carbide single crystal substrate 80 is located closer to center 80p relative to boundary 80d between first main surface 80a and first side end portion 80c in the direction parallel to first main surface 80a. Accordingly, there can be obtained silicon carbide substrate 10 from which stepped portions 2 on boundary 80d have been removed. Accordingly, cracks can be suppressed from being generated in a silicon dioxide layer when the silicon dioxide layer is formed on silicon carbide substrate 10.

Moreover, according to silicon carbide substrate 10 according to the first embodiment, silicon carbide epitaxial layer 81 includes second side end portion 81c that connects third main surface 10b and fourth main surface 10a to each other. When viewed in a cross section, second side end portion 81c is formed to have a curvature in conformity with first side end portion 80c. Accordingly, there can be obtained silicon carbide substrate 10 from which stepped portions 2 on boundary 80d have been removed. Accordingly, cracks can be suppressed from being generated in a silicon dioxide layer when the silicon dioxide layer is formed on silicon carbide substrate 10.

Further, according to silicon carbide substrate 10 according to the first embodiment, thickness H2 of silicon carbide epitaxial layer 81 on center 80p of first main surface 80a is not less than 5 µm. Stepped portions 2, which are a cause of cracks in a silicon dioxide layer, are considered to be generated remarkably when the thickness of silicon carbide epitaxial layer 81 is not less than 5 µm. Accordingly, cracks can be suppressed more effectively from being generated in the silicon dioxide layer when the thickness of silicon carbide epitaxial layer 81 is not less than 5 µm.

Second Embodiment

Figure 13:
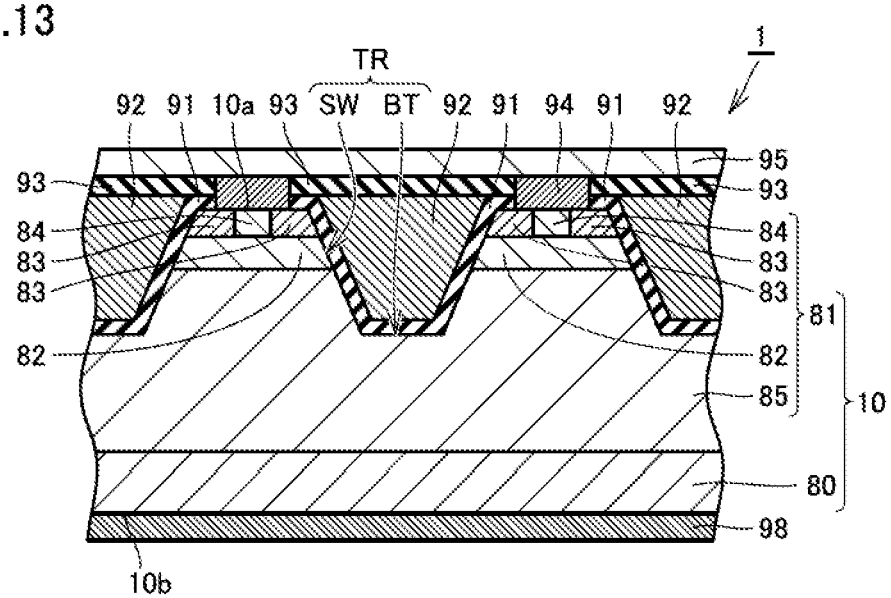
FIG. 13 is a schematic cross sectional view schematically showing a structure of a silicon carbide semiconductor device in a second embodiment of the present invention.
Figure 14:
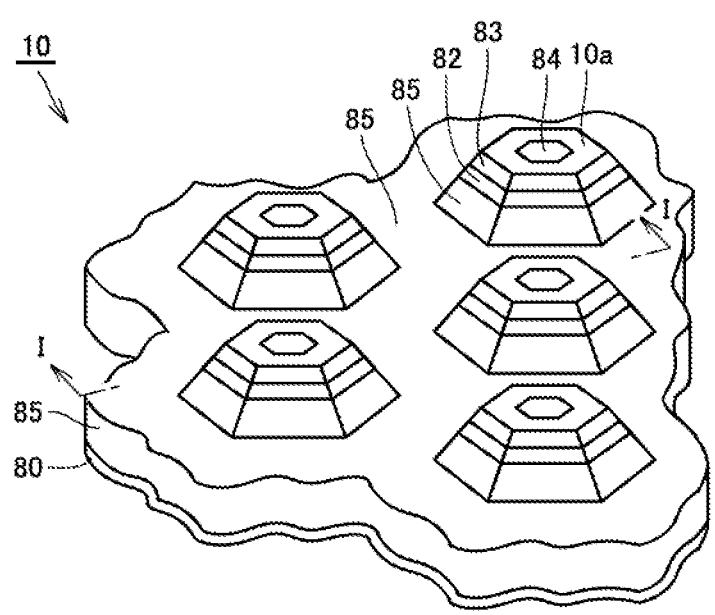
FIG. 14 is a schematic perspective view schematically showing a structure of a silicon carbide substrate included in the silicon carbide semiconductor device in the second embodiment of the present invention.

With reference to FIG. 13 and FIG. 14, the following describes a structure of a MOSFET 1 serving as a silicon carbide semiconductor device according to a second embodiment.

MOSFET 1 according to the second embodiment mainly includes silicon carbide substrate 10, gate insulating films 91, gate electrodes 92, interlayer insulating films 93, source electrodes 94, a source interconnection 95, and a drain electrode 98. Silicon carbide substrate 10 is silicon carbide substrate 10 described in the first embodiment. That is, silicon carbide substrate 10 has silicon carbide single crystal substrate 80 and silicon carbide epitaxial layer 81. Silicon carbide substrate 10 further includes p type base regions 82, n type regions 83, and p type contact regions 84.

Each of p type base regions 82 has p type (second conductivity type). P type base region 82 is provided on n type drift region 85. P type base region 82 has an impurity concentration of $1 \times 10^{18}$ cm$^{-3}$, for example. N type region 83 has n type (first conductivity type). N type region 83 is provided on p type base region 82 so as to be separated from n type drift region 85 by p type base region layer 82. P type contact region 84 has p type. P type contact region 84 is connected to source electrode 94 and p type base region 82.

A trench TR is provided in fourth main surface 10a of silicon carbide substrate 10. Trench TR has a wall surface SW and a bottom portion BT. Wall surface SW extends to n type drift region 85 through n type region 83 and p type base region 82. Wall surface SW includes a channel surface of MOSFET 1 on p type base region 82.

Wall surface SW is inclined relative to fourth main surface 10a of silicon carbide substrate 10, and trench TR is expanded in a tapered manner toward the opening. Wall surface SW preferably has a plane orientation inclined relative to a (000-1) plane by not less than 50° and not more than 65°. Bottom portion BT is located on n type drift region 85. In the present embodiment, bottom portion BT is a surface substantially parallel to fourth main surface 10a of silicon carbide substrate 10.

Gate insulating film 91 covers each of wall surface SW and bottom portion BT of trench TR. Gate electrode 92 is provided on gate insulating film 91. Source electrode 94 is in contact with each of n type region 83 and p type contact region 84. Source interconnection 95 is in contact with source electrode 94. Source interconnection 95 is an aluminum layer, for example. Interlayer insulating film 93 insulates between gate electrode 92 and source interconnection 95. Drain electrode 98 (backside electrode) is disposed in contact with silicon carbide single crystal substrate 80.

Next, with reference to FIG. 15 to FIG. 26, the following describes a method for manufacturing MOSFET 1 according to the second embodiment.

First, silicon carbide substrate 10 is prepared by the same method as the method for manufacturing silicon carbide substrate 10 described in the first embodiment. Specifically, the silicon carbide single crystal substrate preparing step (S10: FIG. 3, FIG. 15), the silicon carbide epitaxial layer forming step (S20: FIG. 3, FIG. 15), and the epitaxial layer end portion removing step (S30: FIG. 3. FIG. 15) are performed.

Next, a step of forming the p type base region and the n type drift region is performed. Specifically, with reference to FIG. 16, in order to form p type base region 82, ions of an impurity for providing p type, such as aluminum (Al), are implanted into the entire fourth main surface 10a of n type drift region 85. Moreover, in order to form n type region 83, ions of an impurity for providing n type, such as phosphorus (P), are implanted into the entire fourth main surface 10a. It should be noted that instead of the ion implantation, epitaxial growth involving addition of an impurity may be used.

Next, the silicon dioxide layer forming step (S40: FIG. 15) is performed Specifically, with reference to FIG. 17 and FIG. 18, silicon dioxide layer 61 is formed in contact with fourth main surface 10a and second side end portion 81c of silicon carbide epitaxial layer 81 as well as first side end portion 80c of silicon carbide single crystal substrate 80. Silicon dioxide layer 61 is formed, for example, by CVD. Thickness H3 of silicon dioxide layer 61 in a position facing center 80p of silicon carbide single crystal substrate 80 is, for example, not less than 0.8 µm and not more than 20 µm. Preferably, thickness H3 of silicon dioxide layer 61 is not less than 1.0 µm and not more than 2.2 µm, for example. Next, heat treatment may be performed to render silicon dioxide layer 61 dense. The heat treatment for rendering silicon dioxide layer 61 dense is performed by holding silicon dioxide layer 61 for 30 minutes at a temperature of 850° C. in a nitrogen atmosphere. Next, on silicon dioxide layer 61, photolithography is performed to form a resist layer having an opening corresponding to a position in which p type contact region 84 is to be formed (not shown). Next, a portion of silicon dioxide layer 61 is etched to form an ion implantation mask 61 having an opening corresponding to the position in which p type contact region 84 is to be formed. Ion implantation mask 61 is made of silicon dioxide.

Figure 19:
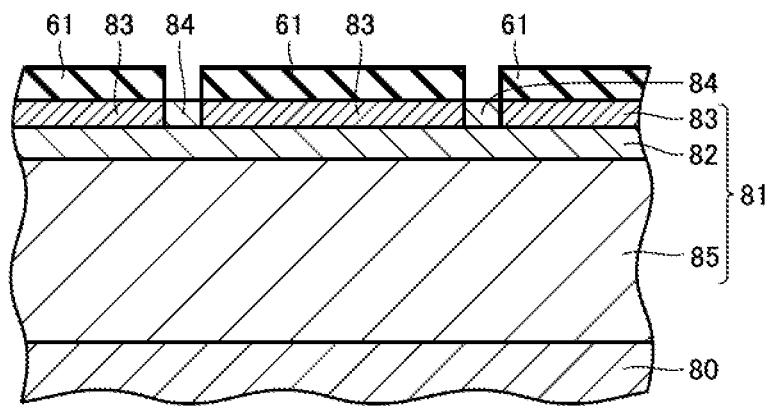
FIG. 19 is a schematic cross sectional view schematically showing a third step of the method for manufacturing the silicon carbide semiconductor device in the second embodiment of the present invention.
Figure 20:
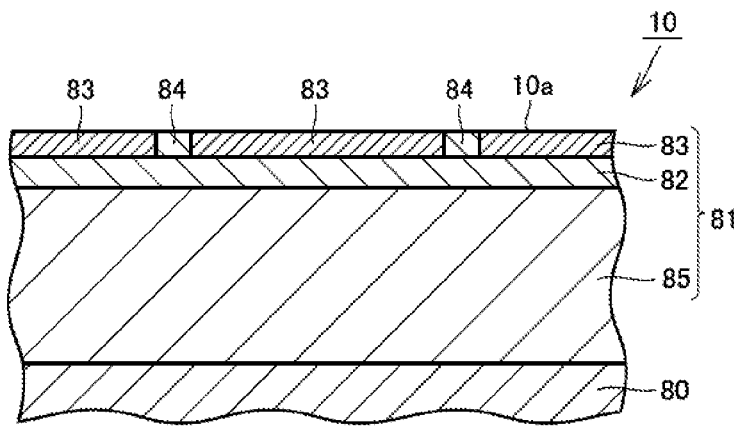
FIG. 20 is a schematic cross sectional view schematically showing a fourth step of the method for manufacturing the silicon carbide semiconductor device in the second embodiment of the present invention.

Next, an ion implantation step (S50: FIG. 15) is performed. With reference to FIG. 19, p type contact region 84 is formed by ion implantation using ion implantation mask 61. Specifically, using ion implantation mask 61, ions of an impurity for providing p type such as aluminum (Al) are implanted into fourth main surface 10a. Next, ion implantation mask 61 is removed (FIG. 20). Thus, by the photolithography method and the ion implantation, p type contact region 84 is formed to connect fourth main surface 10a of silicon carbide substrate 10 and p type base region 82 to each other.

Next, heat treatment is performed to activate the impurities. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere.

Figure 21:
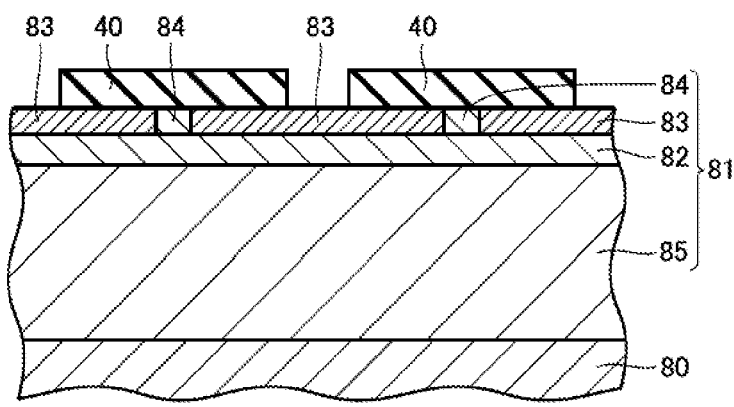
FIG. 21 is a schematic cross sectional view schematically showing a fifth step of the method for manufacturing the silicon carbide semiconductor device in the second embodiment of the present invention.
Figure 22:
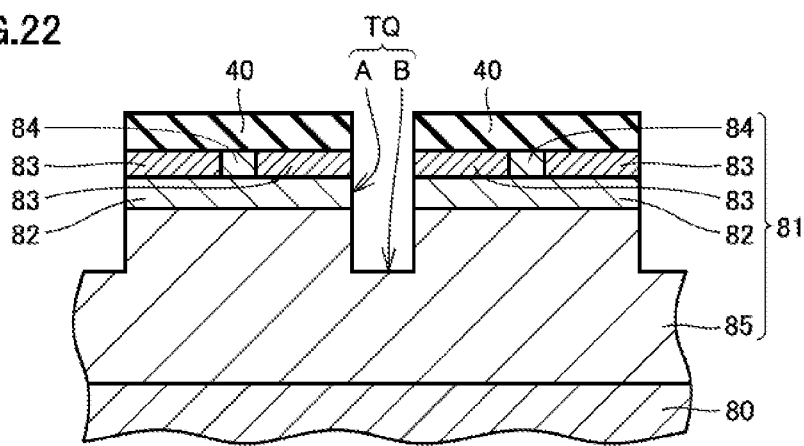
FIG. 22 is a schematic cross sectional view schematically showing a sixth step of the method for manufacturing the silicon carbide semiconductor device in the second embodiment of the present invention.

With reference to FIG. 21, a mask layer 40 having an opening is formed by the photolithography method on the surface constituted of n type region 83 and p type contact region 84. As mask layer 40, silicon dioxide or the like can be used, for example. The opening is formed corresponding to the position in which trench TR (FIG. 13) is to be formed.

Next, a recess forming step (S60: FIG. 15) is performed. Specifically, with reference to FIG. 22, silicon carbide substrate 10 having mask layer 40 formed thereon is subjected to plasma etching, thereby forming a recess TQ in fourth main surface 10a of silicon carbide substrate 10. Recess TQ is formed by removing, through the opening of mask layer 40, n type region 83, p type base region 82, and a portion of n type drift region 85 of silicon carbide substrate 10 by means of etching. As an exemplary etching method, dry etching can be used, more specifically, inductively coupled plasma reactive ion etching (ICP-RIE) can be used. For example, by providing ICP-RIE to fourth main surface 10a of silicon carbide substrate 10 using $SF_6$ or a mixed gas of $SF_6$ and $O_2$ as reactive gas, recess TQ having a wall surface A, which extends substantially in the thickness direction (longitudinal direction in the figure) of silicon carbide substrate 10, and a bottom portion B is formed in the region in which trench TR (FIG. 1) is to be formed.

Next, a thermal etching step (S70: FIG. 15) is performed. Specifically, recess TQ formed in silicon carbide substrate 10 is thermally etched. In the thermal etching step, while supplying the furnace with gas including chlorine, wall surface A of recess TQ of silicon carbide substrate 10 is thermally etched in the furnace. Wall surface A of recess TQ of silicon carbide substrate 10 is etched by heating silicon carbide substrate 10 for about 20 minutes at not less than 1000° C. and not more than 1800° C. in the furnace, for example. The temperature of the thermal etching of silicon carbide substrate 10 is preferably not less than 800° C., is more preferably not less than 1300° C., and is further preferably not less than 1500° C. It should be noted that mask layer 40, which is formed of silicon dioxide and therefore has a very large selection ratio relative to silicon carbide, is not substantially etched during the thermal etching of silicon carbide.

Figure 23:
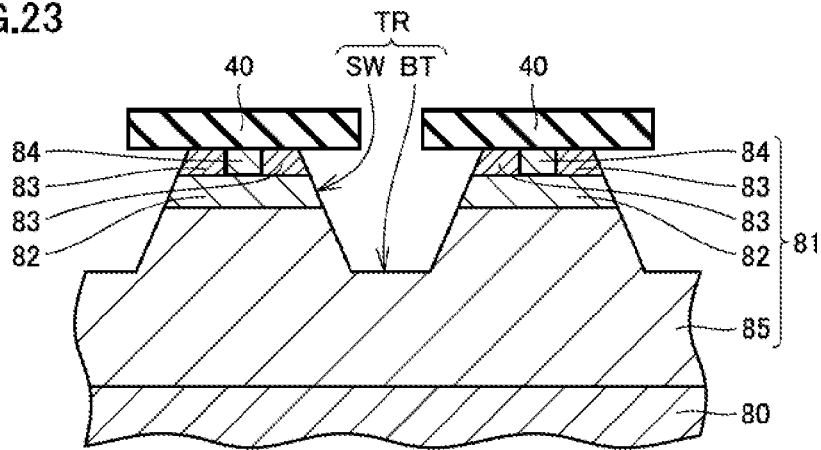
FIG. 23 is a schematic cross sectional view schematically showing a seventh step of the method for manufacturing the silicon carbide semiconductor device in the second embodiment of the present invention.
Figure 24:
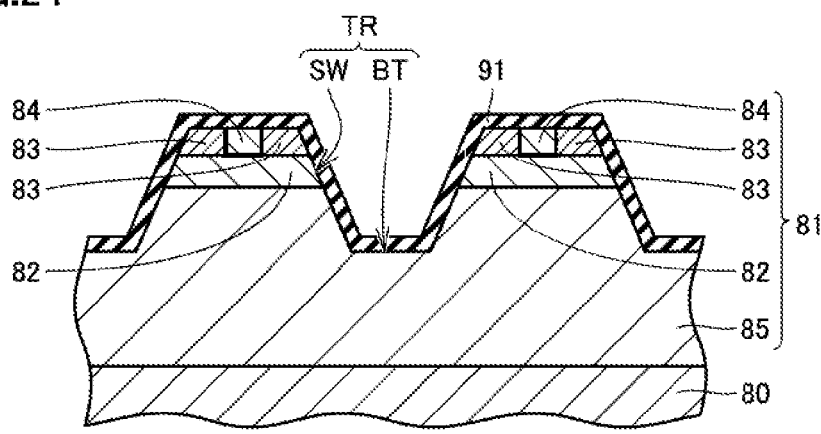
FIG. 24 is a schematic cross sectional view schematically showing an eighth step of the method for manufacturing the silicon carbide semiconductor device in the second embodiment of the present invention.
Figure 25:
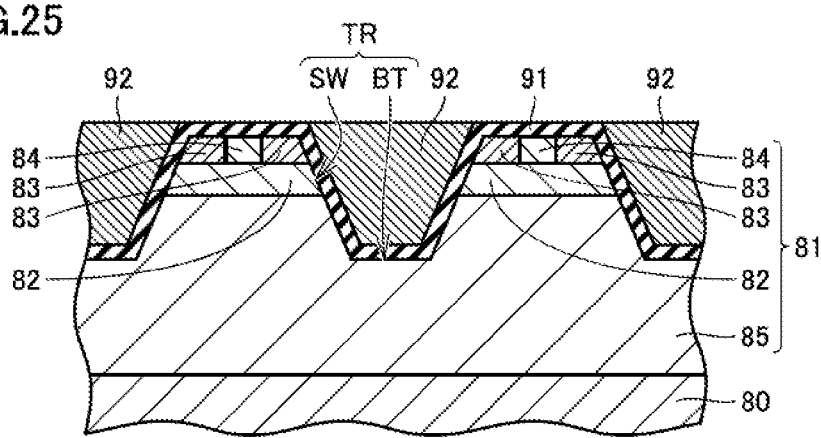
FIG. 25 is a schematic cross sectional view schematically showing a ninth step of the method for manufacturing the silicon carbide semiconductor device in the second embodiment of the present invention.
Figure 26:
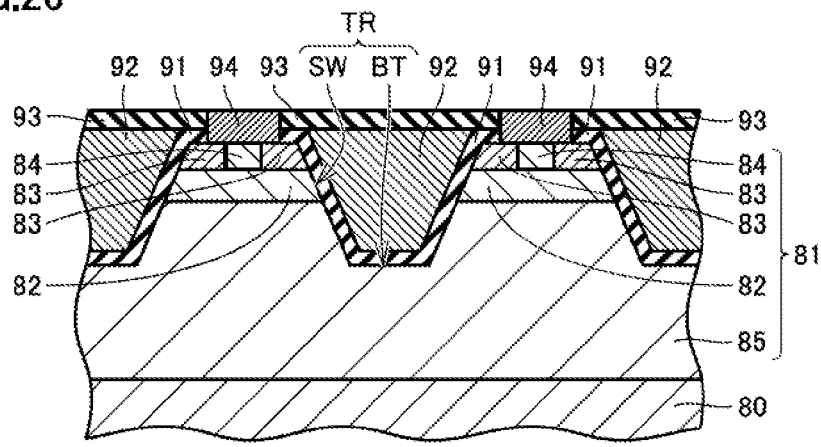
FIG. 26 is a schematic cross sectional view schematically showing a tenth step of the method for manufacturing the silicon carbide semiconductor device in the second embodiment of the present invention.

As shown in FIG. 23, by performing the thermal etching step, wall surface A and bottom portion B of recess TQ are etched by, for example, about 2 nm to 0.1 μm, thereby forming, in silicon carbide substrate 10, trench TR constituted of wall surface SW and bottom portion BT. Next, mask layer 40 is removed by an appropriate method such as etching. Trench TR is constituted of wall surface SW serving as a side surface and bottom portion BT continuously connected to wall surface SW. Bottom portion BT may be a surface and may be a line. In the case where bottom portion BT is a line, the shape of trench TR is in the form of V when viewed in a cross section.

Next, a gate insulating film forming step (80: FIG. 15) is performed. Specifically, with reference to FIG. 24, after forming trench TR by thermally etching wall surface A of recess TQ, gate insulating film 91 is formed in contact with wall surface SW of trench TR. Gate insulating film 91 is formed in contact with n type drift region 85, p type base region 82, n type region 83, and p type contact region 84 so as to cover each of wall surface SW and bottom portion BT of trench TR. Gate insulating film 91 is made of silicon dioxide, and is formed by thermal oxidation, for example.

After the formation of gate insulating film 91, NO annealing may be performed using nitrogen monoxide (NO) gas as an atmospheric gas. Specifically, for example, silicon carbide substrate 10 having gate insulating film 91 formed thereon is held for about 1 hour at a temperature of not less than 1100° C. and not more than 1300° C. in a nitrogen monoxide atmosphere.

Next, a gate electrode forming step (S90: FIG. 15) is performed. Specifically, with reference to FIG. 25, gate electrode 92 is formed on gate insulating film 91. Specifically, gate electrode 92 is formed on gate insulating film 91 so as to fill the region within trench TR with gate insulating film 91 interposed therebetween. Gate electrode 92 can be formed by, for example, forming a film of conductor or doped polysilicon and performing CMP.

Next, an interlayer insulating film forming step is performed. Specifically, interlayer insulating film 93 is formed on gate electrode 92 and gate insulating film 91 so as to cover the exposed surface of gate electrode 92. Etching is performed to form an opening in interlayer insulating film 93 and gate insulating film 91. Through the opening, each of n type region 83 and p type contact region 84 is exposed on fourth main surface 10a. Interlayer insulating film 93 has a thickness of 1.0 μm, for example. The thickness of interlayer insulating film 93 is, for example, not less than 0.8 μm and not more than 20 μm and is preferably not less than 1.0 μm and not more than 2.2 μm.

Next, a source electrode forming step (S100: FIG. 15) is performed. Source electrode 94 is formed on fourth main surface 10a in contact with each of n type region 83 and p type contact region 84. Specifically, for example, by sputtering, a metal film including Ti, Al, and Si is formed in contact with each of n type region 83 and p type contact region 84. Next, by annealing, at about 1000° C., silicon carbide substrate 10 having the metal film formed thereon, the metal film is alloyed, thereby forming source electrode 94 in ohmic contact with silicon carbide substrate 10. In a similar manner, drain electrode 98 may be formed on second main surface 80b of silicon carbide single crystal substrate 80.

With reference to FIG. 13 again, source interconnection 95 is formed in contact with source electrode 94 and interlayer insulating film 93. As source interconnection 95, a Ti/Al layer is used, for example. In this way, MOSFET 1 according to the second embodiment is completed.

Next, the following describes function and effect of MOSFET 1 according to the second embodiment.

According to the method for manufacturing MOSFET 1 according to the second embodiment, silicon carbide substrate 10 manufactured by the method described in the first embodiment is prepared. Silicon dioxide layer 61, 93 is formed to be disposed to face main surface 10a of silicon carbide epitaxial layer 81. Accordingly, cracks can be suppressed from being generated in silicon dioxide layer 61, 93 disposed to face main surface 10a of silicon carbide epitaxial layer 81.

Moreover, according to the method for manufacturing MOSFET 1 according to the second embodiment, silicon dioxide layer 61 includes ion implantation mask 61a. Accordingly, cracks can be suppressed from being generated in ion implantation mask 61a.

Further, according to the method for manufacturing MOSFET 1 according to the second embodiment, ion implantation mask 61a is in contact with first side end portion 80c of silicon carbide single crystal substrate 80. Since ion implantation mask 61a is formed in contact with first side end portion 80c from which stepped portions 2 have been removed, cracks can be suppressed from being generated in ion implantation mask 61a.

Furthermore, according to the method for manufacturing MOSFET 1 according to the second embodiment, silicon dioxide layer 93 includes interlayer insulating film 93. Accordingly, cracks can be suppressed from being generated in interlayer insulating film 93.

Furthermore, according to the method for manufacturing MOSFET 1 according to the second embodiment, thickness H3 of silicon dioxide layer 61, 93 is not less than 0.8 μm and not more than 20 μm. Accordingly, also when thickness H3 of silicon dioxide layer 61, 93 is not less than 0.8 μm and not more than 20 μm, cracks can be suppressed from being generated in silicon dioxide layer 61, 93.

Furthermore, the method for manufacturing MOSFET 1 according to the second embodiment further includes the step of annealing silicon carbide substrate 10 and silicon dioxide layer 61, 93 after the step of forming the silicon dioxide layer. Accordingly, also when silicon carbide substrate 10 and silicon dioxide layer 61, 93 are annealed, cracks can be suppressed from being generated in silicon dioxide layer 61, 93.

MOSFET 1 according to the second embodiment includes: silicon carbide substrate 10 described in the first embodiment; and silicon dioxide layer 93 disposed to face silicon carbide epitaxial layer 81. Accordingly, cracks can be suppressed in silicon dioxide layer 93 of MOSFET 1.

Moreover, according to MOSFET 1 according to the second embodiment, silicon dioxide layer 93 is interlayer insulating film 93. Accordingly, cracks can be suppressed in interlayer insulating film 93 of the MOSFET.

Furthermore, according to MOSFET 1 according to the second embodiment, thickness H3 of silicon dioxide layer 93 is not less than 0.8 μm and not more than 20 μm. Also when thickness 113 of silicon dioxide layer 93 is not less than 0.8 μm and not more than 20 μm, cracks can be suppressed from being generated in silicon dioxide layer 93.

Third Embodiment

Next, the following describes a configuration of a silicon carbide substrate 10 according to a third embodiment. The configuration of silicon carbide substrate 10 according to the third embodiment is the same as the configuration of silicon carbide substrate 10 according to the first embodiment apart from the following points. Therefore, the same or corresponding portions are given the same reference characters and are not described repeatedly. Specifically, outer circumferential end portion 81t of third main surface 10b of silicon carbide epitaxial layer 81 and boundary 80d between first main surface 80a and first side end portion 80c of silicon carbide single crystal substrate 80 in silicon carbide substrate 10 according to the first embodiment are located at substantially the same position in the direction parallel to first main surface 80a, whereas outer circumferential end portion 81t of third main surface 10b of silicon carbide epitaxial layer 81 in silicon carbide substrate 10 according to the third embodiment is located to be closer to center 80p relative to boundary 80d between first main surface 80a and first side end portion 80c of silicon carbide single crystal substrate 80 in the direction parallel to first main surface 80a.

Figure 27:
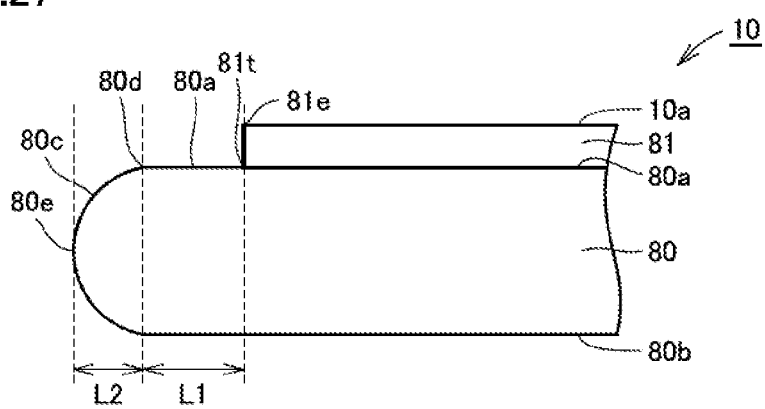
FIG. 27 is a schematic cross sectional view schematically showing a structure of a silicon carbide substrate in a third embodiment of the present invention.

With reference to FIG. 27, silicon carbide substrate 10 according to the third embodiment mainly includes silicon carbide single crystal substrate 80 and silicon carbide epitaxial layer 81. Silicon carbide epitaxial layer 81 includes: third main surface 10b in contact with center 80p of first main surface 80a; and fourth main surface 10a opposite to third main surface 10b. When viewed in a cross section, outer circumferential end portion 81e of fourth main surface 10a is located closer to center 80p relative to boundary 80d between first main surface 80a and first side end portion 80c in the direction parallel to first main surface 80a. Moreover, outer circumferential end portion 81t of third main surface 10b of silicon carbide epitaxial layer 81 is located to be closer to center 80p relative to boundary 80d between first main surface 80a and first side end portion 80c of silicon carbide single crystal substrate 80 in the direction parallel to first main surface 80a. Distance L1 from outer circumferential end portion 81e of fourth main surface 10a to boundary 80d in the direction parallel to first main surface 80a is not less than 200 μm and not more than 1000 μm, for example. Distance L1 is preferably not less than 300 μm and not more than 600 μm. Moreover, distance L2 from outermost circumferential portion 80e of silicon carbide single crystal substrate 80 to boundary 80d in the direction parallel to first main surface 80a is 150 μm. Preferably, silicon carbide epitaxial layer 81 is not disposed at boundary 80d and first side end portion 80c of silicon carbide single crystal substrate 80.

The following describes a method for manufacturing silicon carbide substrate 10 according to the third embodiment. The method for manufacturing silicon carbide substrate 10 according to the third embodiment is the same as the method for manufacturing silicon carbide substrate 10 according to the first embodiment apart from the epitaxial layer end portion removing step (S30: FIG. 3).

With reference to FIG. 3, the silicon carbide single crystal substrate preparing step (S10: FIG. 3) and the silicon carbide epitaxial layer forming step (S20: FIG. 3) are performed in the same manner as in the method described in the first embodiment.

Next, the epitaxial layer end portion removing step (S30: FIG. 3) is performed. Specifically, with reference to FIG. 27, first side end portion 80c of silicon carbide single crystal substrate 80, boundary 80d between first main surface 80a and first side end portion 80c, and silicon carbide epitaxial layer 81 formed on a portion of first main surface 80a are removed, whereby silicon carbide epitaxial layer 81 in contact with center 80p of silicon carbide single crystal substrate 80 remains. Accordingly, stepped portions 2 formed at the end portion of silicon carbide epitaxial layer 81 are removed. The width of the removed silicon carbide epitaxial layer 81 in the direction parallel to first main surface 80a is found by distance L2+distance L1. Distance L2 is 150 μm and distance L1 is not less than 200 μm and not more than 1000 μm, for example. Distance L1 is preferably not less than 300 μm and not more than 600 μm. Silicon carbide epitaxial layer 81 may be removed by dry etching or wet etching. For conditions of the dry etching, the removal is attained by treatment employing plasma using, for example, Ar physically or $SF_6$ chemically or treatment in combination thereof whereas for conditions of the wet etching, the removal is attained by, for example, NaOH (sodium hydroxide), KOH (potassium hydroxide), or a combination thereof.

Figure 29:
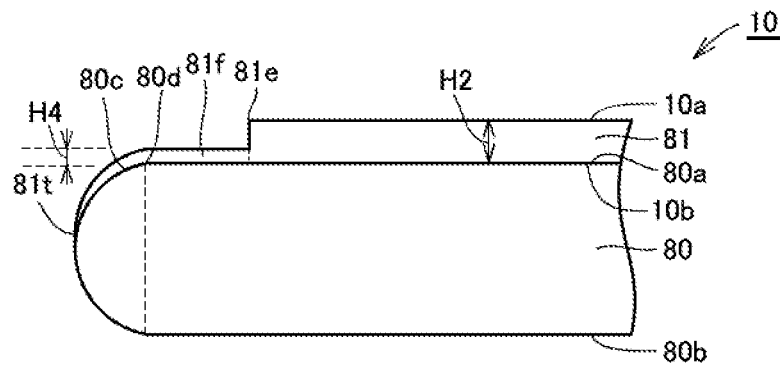
FIG. 29 is a schematic cross sectional view schematically showing a first modification of a third step of the method for manufacturing the silicon carbide substrate in the third embodiment of the present invention.

With reference to FIG. 29, by the epitaxial layer end portion removing step (S30: FIG. 3), silicon carbide epitaxial layer 81 having a thickness comparable to the depth of stepped portions 2 may be removed and a portion of silicon carbide epitaxial layer 81 may remain as a remaining epitaxial portion 81f. Remaining epitaxial portion 81f is provided on and in contact with first side end portion 80c of silicon carbide single crystal substrate 80. Thickness H4 of remaining epitaxial portion 81f on boundary 80d is less than thickness H2 of silicon carbide epitaxial layer 81 on center 80p of first main surface 80a. Remaining epitaxial portion 81f is a portion remaining as a result of the removal of stepped portions 2 described in the first embodiment. Outer circumferential end portion 81e of fourth main surface 10a of silicon carbide epitaxial layer 81 is located to be closer to center 80p relative to boundary 80d in the direction parallel to first main surface 80a.

Figure 30:
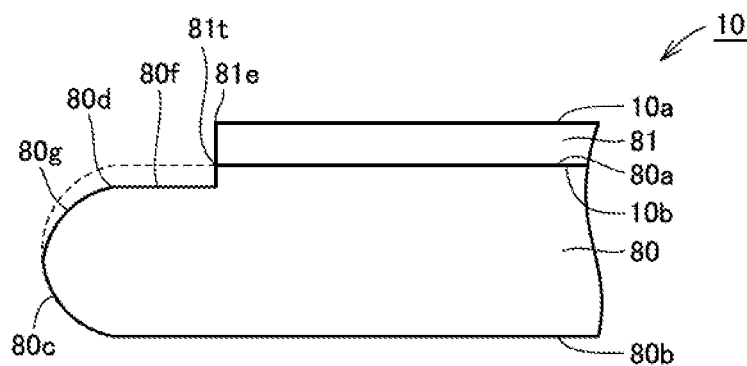
FIG. 30 is a schematic cross sectional view schematically showing a second modification of the third step of the method for manufacturing the silicon carbide substrate in the third embodiment of the present invention.

With reference to FIG. 30, by the epitaxial layer end portion removing step (S30: FIG. 3), a portion of first main surface 80a and a portion of first side end portion 80c may be over-etched. By the over-etching of the portion of first main surface 80a and the portion of first side end portion 80c, a stepped surface 80f is formed at the end portion of first main surface 80a. Stepped surface 80f is formed by etching first main surface 80a along a surface extending from outer circumferential end portion 81e of fourth main surface 10a of silicon carbide epitaxial layer 81 to outer circumferential end portion 81t of third main surface 10b. The distance from stepped surface 80f to second main surface 80b is shorter than the distance from first main surface 80a to the second main surface.

Next, the following describes function and effect of MOSFET 1 according to the third embodiment.

According to silicon carbide substrate 10 according to the third embodiment, outer circumferential end portion 81t of third main surface 10b is located closer to center 80p relative to boundary 80d between first main surface 80a and first side end portion 80c in the direction parallel to first main surface 80a. Accordingly, there can be obtained silicon carbide substrate 10 from which silicon carbide epitaxial layer 81 on boundary 80d has been removed. Accordingly, cracks can be suppressed from being generated in a silicon dioxide layer when the silicon dioxide layer is formed on silicon carbide substrate 10.

Moreover, according to silicon carbide substrate 10 according to the third embodiment, distance L1 from outer circumferential end portion 81e of fourth main surface 10a to boundary 80d in the direction parallel to first main surface 80a is not less than 10 m and not more than 5000 μm. Accordingly, there can be obtained silicon carbide substrate 10 from which stepped portions 2 on boundary 80d have been removed effectively. Accordingly, cracks can be suppressed from being generated in a silicon dioxide layer when the silicon dioxide layer is formed on silicon carbide substrate 10.

Fourth Embodiment

Next, the following describes configuration and manufacturing method of a MOSFET 1 according to a fourth embodiment. The configuration and manufacturing method of MOSFET 1 according to the fourth embodiment are different from those of MOSFET 1 according to the second embodiment in that MOSFET 1 according to the fourth embodiment uses silicon carbide substrate 10 according to the third embodiment whereas MOSFET 1 according to the second embodiment uses silicon carbide substrate 10 according to the first embodiment, and the other configuration and manufacturing method are the same as those of MOSFET 1 according to the second embodiment.

Figure 28:
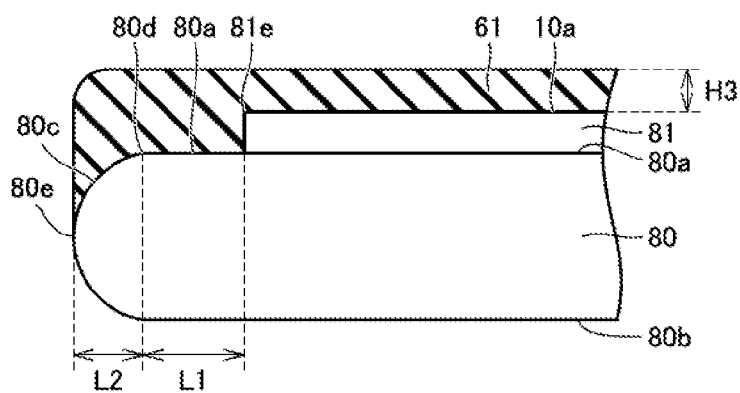
FIG. 28 is an enlarged schematic cross sectional view schematically showing an end portion of a silicon carbide semiconductor device in a second step of a method for manufacturing a silicon carbide semiconductor device in a fourth embodiment of the present invention.

With reference to FIG. 28, the method for manufacturing MOSFET 1 according to the fourth embodiment will be described. As described above, the method for manufacturing MOSFET 1 according to the fourth embodiment uses silicon carbide substrate 10 according to the third embodiment.

In the same manner as in the method for manufacturing silicon carbide substrate 10 according to the third embodiment, the silicon carbide single crystal substrate preparing step (S10: FIG. 3, FIG. 15), the silicon carbide epitaxial layer forming step (S20. FIG. 3, FIG. 15), and the epitaxial layer end portion removing step (S30: FIG. 3, FIG. 15) are performed, thereby preparing silicon carbide substrate 10 shown in FIG. 27.

Next, the silicon dioxide layer forming step (S40: FIG. 15) is performed. Specifically, with reference to FIG. 28, silicon dioxide layer 61 serving as an ion implantation mask is formed in contact with first side end portion 80c and a portion of first main surface 80a of silicon carbide single crystal substrate 80 and fourth main surface 10a of silicon carbide epitaxial layer 81.

Thereafter, the ion implantation step (S50: FIG. 15), the recess forming step (S60: FIG. 15), the thermal etching step (S70: FIG. 15), the gate insulating film forming step (S80: FIG. 15), the gate electrode forming step (S90: FIG. 15), and the source electrode forming step (S70: FIG. 15) are performed in the same manner as in the method described in the third embodiment, thereby manufacturing MOSFET 1 shown in FIG. 13.

It should be noted that the first conductivity type is assumed as n type and the second conductivity type is assumed as p type in each of the above-described embodiments, but the first conductivity type may be p type and the second conductivity type may be n type. Moreover, the MOSFETs have been exemplified as examples of the silicon carbide semiconductor devices in the second and fourth embodiments, the silicon carbide semiconductor devices may be an IGBT (Insulated Gate Bipolar Transistor), a SBD (Schottky Barrier Diode), and the like.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: silicon carbide semiconductor device (MOSFET); 2: stepped portion; 3: step; 10: silicon carbide substrate; 10a:

fourth main surface; 10*b*: third main surface; 40: mask layer; 61: silicon dioxide layer (ion implantation mask); 80: silicon carbide single crystal substrate; 80*a*: first main surface; 80*b*: second main surface; 80*c*: first side end portion; 80*d*, 81*d*: boundary; 80*e* outermost circumferential portion; 80*f*: stepped surface; 80*p*: center; 81: silicon carbide epitaxial layer (n type drift region); 81*c*: second side end portion; 81*e*, 81*t*: outer circumferential end portion; 81*f*: remaining epitaxial portion; 82: p type base region; 83: n type region, 84: p type contact region; 91: gate insulating film; 92: gate electrode, 93: interlayer insulating film; 94: source electrode; 95: source interconnection; 98: drain electrode; A, SW: wall surface; B, BT bottom portion: IF: index flat portion; OF: orientation flat portion; TQ: recess; TR: trench; a1: <1-100> direction; a2, a4, a5: <11-20> direction; a3: extension direction.

The invention claimed is:

1. A method for manufacturing a silicon carbide substrate comprising steps of:
    preparing a silicon carbide single crystal substrate having a first main surface, a second main surface, and a first side end portion, said second main surface being opposite to said first main surface, said first side end portion connecting said first main surface and said second main surface to each other, said first main surface having a width with a maximum value of more than 100 mm;
    forming a silicon carbide epitaxial layer in contact with said first side end portion, said first main surface, and a boundary between said first main surface and said first side end portion; and
    removing said silicon carbide epitaxial layer formed in contact with said first side end portion and said boundary, and
    in the step of forming said silicon carbide epitaxial layer, said silicon carbide epitaxial layer is formed to have a stepped portion on said boundary, and
    in the step of removing said silicon carbide epitaxial layer, said stepped portion is removed.

2. The method for manufacturing the silicon carbide substrate according to claim 1, wherein
    said stepped portion is formed to extend along a straight line obtained by rotating, in said first main surface in a range of ±20°, a straight line obtained by projecting a straight line parallel to a <11-20> direction onto said first main surface.

3. The method for manufacturing the silicon carbide substrate according to claim 1, wherein said stepped portion has a length of not less than 50 μm and not more than 5000 μm in a direction from said first side end portion toward said center.

4. The method for manufacturing the silicon carbide substrate according to claim 1, wherein said stepped portion has a depth of not less than 1 μm and not more than 50 μm in a direction perpendicular to said first main surface.

5. The method for manufacturing the silicon carbide substrate according to claim 1, wherein said silicon carbide epitaxial layer has a thickness of not less than 5 μm on a center of said first main surface.

6. A method for manufacturing a silicon carbide semiconductor device, comprising steps of:
    preparing the silicon carbide substrate manufactured by the method recited in claim 1; and
    forming a silicon dioxide layer disposed to face a main surface of said silicon carbide epitaxial layer.

7. The method for manufacturing the silicon carbide semiconductor device according to claim 6, wherein said silicon dioxide layer includes an ion implantation mask.

8. The method for manufacturing the silicon carbide semiconductor device according to claim 7, wherein said ion implantation mask is in contact with said first side end portion of said silicon carbide single crystal substrate.

9. The method for manufacturing the silicon carbide semiconductor device according to claim 6, wherein said silicon dioxide layer includes an interlayer insulating film.

10. The method for manufacturing the silicon carbide semiconductor device according to claim 6, wherein said silicon dioxide layer has a thickness of not less than 0.8 μm and not more than 20 μm.

11. The method for manufacturing the silicon carbide semiconductor device according to claim 6, further comprising a step of annealing said silicon carbide substrate and said silicon dioxide layer after the step of forming said silicon dioxide layer.

12. A silicon carbide substrate comprising:
    a silicon carbide single crystal substrate having a first main surface, a second main surface, and a first side end portion, said second main surface being opposite to said first main surface, said first side end portion connecting said first main surface and said second main surface to each other, said first main surface having a width with a maximum value of more than 100 mm; and
    a silicon carbide epitaxial layer in contact with a center of said first main surface,
    said silicon carbide epitaxial layer including a third main surface and a fourth main surface, said third main surface being in contact with said center of said first main surface, said fourth main surface being opposite to said third main surface,
    said fourth main surface having an outer circumferential end portion located closer to said center relative to a boundary between said first main surface and said first side end portion in a direction parallel to said first main surface, and
    said first side end portion has a curvature to project in an outer circumferential direction when viewed in a cross section, wherein
    said silicon carbide epitaxial layer includes a second side end portion connecting said third main surface and said fourth main surface to each other,
    when viewed in a cross section, said second side end portion is formed to have a curvature in conformity with said first side end portion, and
    said second side end portion has a radius of curvature substantially the same as a radius of curvature of said first side end portion when viewed in a cross-section.

13. The silicon carbide substrate according to claim 12, wherein said silicon carbide epitaxial layer has a thickness of not less than 5 μm on said center of said first main surface.

14. A silicon carbide semiconductor device comprising:
    the silicon carbide substrate recited in claim 12; and
    a silicon dioxide layer disposed to face said silicon carbide epitaxial layer.

15. The silicon carbide semiconductor device according to claim 14, wherein said silicon dioxide layer is an interlayer insulating film.

16. The silicon carbide semiconductor device according to claim 14, wherein said silicon dioxide layer has a thickness of not less than 0.8 μm and not more than 20 μm.

* * * * *